(12) United States Patent
Pai

(10) Patent No.: US 8,136,058 B2
(45) Date of Patent: Mar. 13, 2012

(54) METHOD AND SYSTEM FOR REPRESENTING GEOMETRICAL LAYOUT DESIGN DATA IN ELECTRONIC DESIGN SYSTEMS

(76) Inventor: Ravi R Pai, Bangalore (IN)

( * ) Notice: Subject to any disclaimer, the term of this patent is extended or adjusted under 35 U.S.C. 154(b) by 1177 days.

(21) Appl. No.: 11/912,152

(22) PCT Filed: Feb. 27, 2007

(86) PCT No.: PCT/IN2007/000093
§ 371 (c)(1),
(2), (4) Date: Oct. 22, 2007

(87) PCT Pub. No.: WO2007/099562
PCT Pub. Date: Sep. 7, 2007

(65) Prior Publication Data
US 2008/0231629 A1  Sep. 25, 2008

(30) Foreign Application Priority Data
Mar. 2, 2006  (IN) .............................. 375/CHE/2006

(51) Int. Cl.
*G06F 17/50* (2006.01)

(52) U.S. Cl. ........... 716/55; 716/102; 716/111; 716/136
(58) Field of Classification Search .................. 716/102
See application file for complete search history.

(56) References Cited

U.S. PATENT DOCUMENTS

| | | | | |
|---|---|---|---|---|
| 5,086,477 A | * | 2/1992 | Yu et al. | 382/145 |
| 5,694,481 A | * | 12/1997 | Lam et al. | 382/145 |
| 5,764,234 A | * | 6/1998 | Norizuki et al. | 345/423 |
| 5,887,155 A | * | 3/1999 | Laidig | 716/52 |

* cited by examiner

*Primary Examiner* — Paul Dinh
*Assistant Examiner* — Bryce Aisaka

(57) ABSTRACT

A method and system of representing geometrical layout design data having a plurality of polygons in electronic design systems is provided. The method includes extracting topological characteristics data corresponding to one or more polygons to form one or more virtual topological polygon. Each virtual polygon is represented by Scan order (SO), with SO corresponding to order in which the vertices of polygon are encountered by a sweep line moving in predefined direction with a predefined angular orientation. The method further includes determining dimensional data corresponding to each polygon to form one or more sized polygons using one or more virtual topological polygon. Thereafter, the spatial data corresponding to each sized polygon is extracted to instantiate each sized polygon.

34 Claims, 13 Drawing Sheets

METHOD AND SYSTEM FOR REPRESENTING GEOMETRICAL LAYOUT DESIGN DATA IN ELECTRONIC DESIGN SYSTEMS

FIELD OF THE INVENTION

The present invention relates generally to electronic design systems. More specifically the present invention relates to methods and systems for representing and processing geometrical layout design data in electronic design systems.

BACKGROUND OF THE INVENTION

Electronic design systems go through a series of transformations in terms of levels of abstractions from their design to their getting manufactured. Examples of the electronic design systems may include but are not limited to Integrated Circuit (ICs), IC Packages, Micro Electronic Mechanical Systems (MEMS), Printed Circuit Boards (PCBs), Multi-Chip Modules (MCMs), Photo Mask data, Laser Direct Imaging (LDI), E-Beam technology, silicon debugging, and failure analysis. Each transformation adds more details to the description of the previous level of abstraction of the electronic design system. As a result of this at each succeeding level of abstraction the data becomes voluminous and more specific as compared to a preceding level of abstraction. The lowest level of abstraction, i.e., geometrical layout of an electronic design system, uses geometrical figures like polygons, lines and vertices, which are used to represent locations and orientations of sub-components of the electronic design system with respect to each others. The data generated using the geometrical layout can be called geometrical layout design data. Large memory is required for storing, processing, analyzing, and modifying geometrical layout design data leading to the manufacturing process for the electronic design systems.

The geometrical layout design data is represented using a plurality of polygons. Each polygon corresponds to the whole or a part of an equipotential area in an electronic design system. The information in a polygon has topological information, dimensional information and spatial information. The topological information is the property of a polygon corresponding to the relational information between the vertices of the polygon, which is also sometimes loosely called as shape or pattern of the polygon. The dimensional information gives the polygon a definite size and area. Further, the spatial information gives the exact location to the polygon such that it can be placed spatially in X, Y or Z (layer) coordinates.

In conventional systems, topological information is extracted by capturing lengths of the edges of each polygon in a sequence along with the angle between the edges. Another conventional system, extracts dimensional information and spatial information of a polygon by identifying the cartesian coordinates of the vertices of the polygon in absolute or relative form. Thereafter, the dimensional information of the polygon is extracted from the coordinates of adjacent vertices. The spatial information is extracted based on the coordinate information. In another conventional system, a polygon in the geometrical layout design data is instantiated. Based on the instantiated polygon, topological and dimension information is extracted.

However, the conventional systems that store the geometrical layout design data do not keep the topological information about the polygons explicitly or in easily retrievable form. As a result, topological information of a polygon has to be explicitly extracted from the stored geometrical layout design data through computationally intensive steps, as a result of which operations based on topology of a polygon are more computationally expensive in terms of memory and time. Further, while analyzing geometrical layout design data for topological information or operations which operate on topologies, each polygon has to be analyzed separately that demands additional resources in terms storage in Random Access Memory (RAM). The geometrical layout design data is very often large as compared to the size of the RAM making it difficult to store large amount of polygonal data only in the RAM.

Some conventional methods provide virtual memory systems, which convert a portion of the hard disk into virtual RAM, usually called virtual memory, to store the polygonal data and only parts of polygon data that are required for computations are moved into the RAM. However the data fetching from the virtual memory on a hard disk is slower as compared to the data fetching from the RAM, thus a huge time penalty is incurred whenever polygonal data has to be fetched from the virtual memory on a hard disk.

A number of operations carried out on geometrical layout design data are topology-centric. Hence, these topology-centric operations can potentially be carried out on one polygon and re-used for all polygons with similar topologies. This could potentially speed up the operations significantly. However, as the conventional methods do not store the topological characteristics of polygons explicitly or in easily retrievable form, the conventional methods can not make use of the above scheme for speeding up the topology-centric operations on geometrical layout design data.

There is therefore a need for methods and systems for extracting information regarding the topology of a polygon, retaining this information in a database and utilizing the topological information efficiently for further processing of the geometrical layout design data.

SUMMARY OF THE INVENTION

An object of the invention is to provide a method and system for representing geometrical layout design data in electronic design systems.

Another object of the invention is to provide a method and system for reducing the computational time involved in geometrical layout design data processing.

Yet another object of the invention is to provide a method and system for reducing memory requirements in geometrical layout design data processing.

Another object of the invention is to provide an unambiguous definition for topological information of polygons in geometrical layout design data processing and also to provide a method for capturing and retrieving the topological information of geometries.

Yet another object of the invention is to provide a method and system for making use of topological similarities of the polygons in the geometrical layout design data to speed up the operations carried out on geometrical layout design data.

Another object of the invention is to provide a method and system for creating libraries for storing topological characteristics data and pre-computed geometrical operations on the topological data and later use these libraries to speed up the processing time.

The above listed objectives are achieved by providing a method and system for representing geometrical layout design data having a plurality of polygons in electronic design systems. The method includes extracting topological characteristics data corresponding to one or more polygons to form one or more virtual topological polygon. Each virtual polygon is represented by one or more Scan order (SO), with SO corresponding to the order in which the vertices of polygon are encountered by a sweep line moving in a predefined direction with a predefined angular orientation. The method further includes determining dimensional data corresponding to each polygon to form one or more sized polygons using one or more virtual topological polygon. Thereafter, the spatial data corresponding to each sized polygon is used to instantiate and spatially locate each sized polygon.

BRIEF DESCRIPTION OF THE DRAWINGS

A more complete appreciation of the present invention is provided by reference to the following detailed description when considered in conjunction with accompanying drawing in which reference symbols indicate the same or similar components, wherein.

DETAILED DESCRIPTION OF THE DRAWINGS

Figure 1:
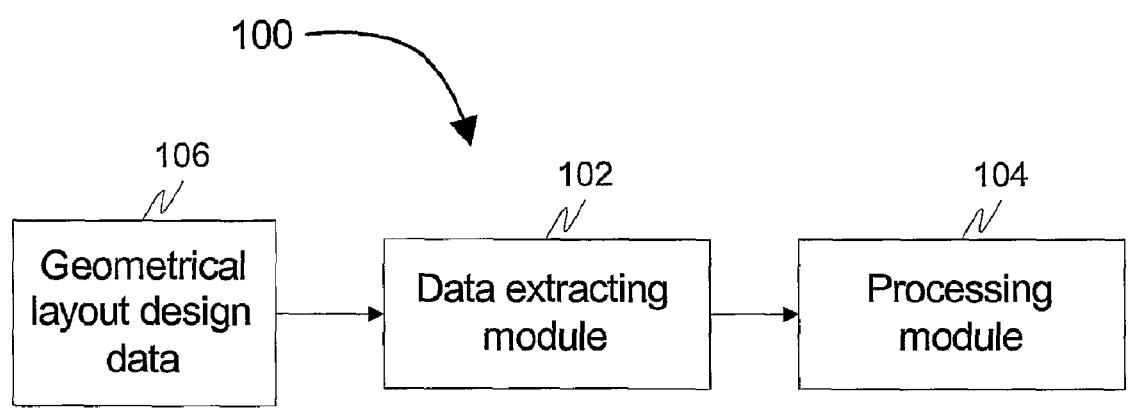
FIG. 1 is block diagram showing an environment in which various embodiments of the invention may function.

Before describing in detail embodiments that are in accordance with the present invention, it should be observed that the embodiments reside primarily in combinations of method steps and system components for representing geometrical layout design data in electronic design systems. Accordingly, the system components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Relative terms such as first and second, top and bottom, and the like may be used solely to distinguish one entity or action from another entity or action without necessarily requiring or implying any actual such relationship or order between such entities or actions. The twins "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. A device or structure that is "configured" in a certain way is configured in at least that way, but may also be configured in ways that are not listed.

Various embodiments of the invention provide methods and systems for representing geometrical layout design data in electronic design systems. Examples of the geometrical layout design data in electronic design systems may include, but are not limited to, Integrated Circuit (IC), IC Packages, Micro Electronic Mechanical Systems (MEMS), Printed Circuit Boards (PCBs), Multi-Chip Modules (MCMs), Photo Mask data, Laser Direct Imaging (LDI), E-beam technology, silicon debugging, and failure analysis. The invention is applicable in various layout and post-layout domains of electronic design systems.

FIG. 1 is block diagram showing an environment 100 (that is exemplary) in which various embodiments can function. Environment 100 includes a data extracting module 102, a processing module 104. Data extracting module 102 extracts data from geometrical layout design data 106. Geometrical layout design data 106 includes a plurality of polygons. Each polygon represents complete equipotential area or a part of an equipotential area of in an electronic design system. Geometrical layout design data 106 may be an image data that is converted into polygonal geometric data before processing. Geometrical layout design data 106 is represented using one or more languages. Examples of the languages may include, but are not limited to, Graphic Design System II (GDSII), Open Artwork System Interchange Standard (OASIS), Layout Exchange Format (LEF), Design Exchange Format (DEF), Electron Beam formats such as Manufacturing Electron Beam Exposure System (MEBES), JEOL, VSB-11/12, OASIS.VSB Data extracting module 102 thereafter segregates geometrical layout design data 106, such that, topology information, dimensional data, and location data for each of the polygons is extracted and stored. Processing module 104, thereafter, performs various geometrical operations, for example, window query, boolean operations, resizing, reflecting, and rotating, on one or more of the topology data, dimensional data, and location data.

Figure 2:
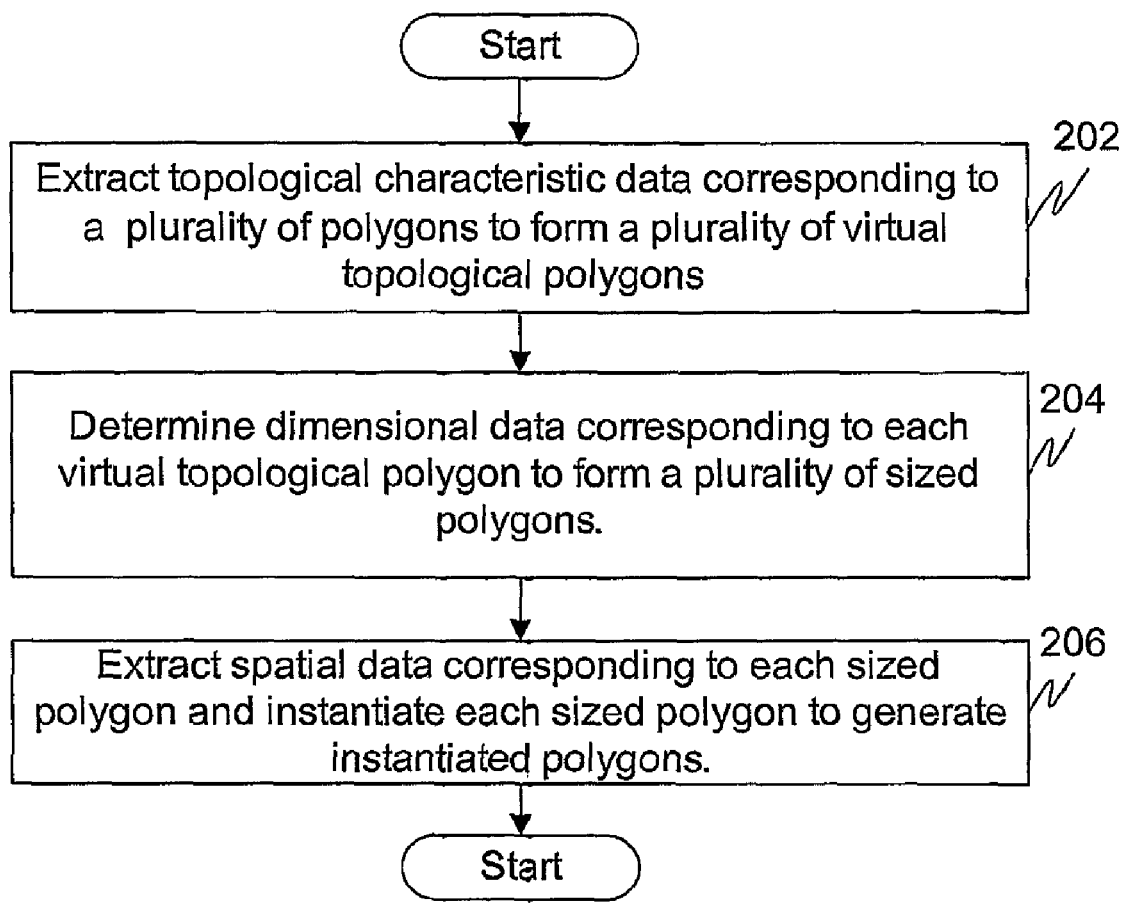
FIG. 2 is a flow chart for representing geometrical layout design data in electronic design systems, in accordance with an embodiment of the invention.

FIG. 2 is a flow chart for representing geometrical layout design data in electronic design systems, in accordance with an embodiment of the invention. The geometrical layout design data comprises a plurality of polygons. A polygon may be one of a Manhattan polygon, and non-Manhattan polygon. To represent the geometrical layout design data, at step 202, topological characteristics data corresponding to the plurality of polygons is extracted to form a plurality of virtual topological polygons. A virtual topological polygon includes only the topological characteristics data for a corresponding polygon and does not include data for the size and the location of the corresponding polygon. Each virtual topological polygon is represented by one or more Scan Orders (SOs). An SO of one or more virtual topological polygons corresponds to the order of vertices of the corresponding one or more polygons encountered by a sweep-line. The SO of one or more virtual topological polygons is stored in the order of vertices. The SO of one or more virtual topological polygons may also be stored in the order of edges, such that, the order of vertices can be determined using the order of edges. This is further explained in conjunction with FIG. 3

In an embodiment of the invention, when the sweep-line scans the plurality of polygons, the sweep-line may encounter a set of distinct polygons that is repeated a number of times in the geometrical layout design data. In this case, the sweep-line may represent a set of distinct virtual topological polygons, which is the topological characteristics data extracted for the set of distinct polygons, by a common set of one or more SOs. Each distinct virtual topological polygon in the set of distinct virtual topological polygons may have dissimilar SO if scanned separately by the sweep-line. The number of distinct virtual topological polygons in a set of distinct virtual topological polygons and the number of vertices in each distinct virtual topological polygon are specified using a first predefined representation. The first predefined representation may be associating a set of distinct virtual topological polygons with a Vertex Count Vector (VCV). A VCV includes a plurality of elements. The plurality of elements correspond to the number of distinct virtual topological polygons in the set of distinct virtual topological polygons. The number of elements are equal to the number of distinct virtual topological in the set of distinct virtual topological polygons. Each element corresponds to the number of vertices of a distinct virtual topological polygon in the set of distinct virtual topological polygon. This is further explained in conjunction with FIG. 5.

In an embodiment of the invention, as the sweep-line scans the plurality of polygons, the sweep-line may encounter one or more hole-polygon. A hole-polygon corresponds to a filled polygon with one or more unfilled polygons. The filled polygon contains one or more unfilled polygons. The topological characteristics data for a hole-polygon is extracted to form a virtual topological hole-polygon. A virtual topological hole-polygon corresponds to a filled virtual topological polygon with one or more unfilled virtual topological polygons contained in it. The sweep-line scans the filled virtual topological polygon and one or more unfilled virtual topological polygons corresponding to the virtual topological hole-polygon and generates their topological information using a common set of one or more SOs. The single filled virtual topological polygon and the number of unfilled virtual topological polygons in a virtual topological hole-polygon and the number of vertices in the filled virtual topological polygon and in each unfilled virtual topological polygon in a virtual topological hole-polygon are specified using a second predefined representation.

The second predefined representation may be associating a virtual topological hole-polygon with a hole-VCV. A hole-VCV includes a positive element and a plurality of negative elements. The positive element corresponds to the number of vertices of the single filled virtual topological polygon. The plurality of negative elements corresponds to one or more unfilled virtual topological polygons. Further, the number of negative elements is equal to the number of unfilled virtual topological polygons and each negative element corresponds to the number of vertices of an unfilled virtual topological polygon. This is further explained in detail in conjunction with FIG. 5.

The sweep-line moves in a predefined direction and has a predefined angular orientation for determining the SO of one or more polygons. The sweep-line may be a vertical sweep-line, which has an angular orientation of 90 degrees with the horizontal axis, and moves in a horizontal direction. The vertical sweep-line determines a Vertical Scan Order (VSO) of a virtual topological polygon and a set of distinct virtual topological polygons. This is further explained in conjunction with FIG. 3. The sweep-line may be a horizontal sweep-line, which is aligned with the horizontal axis, and moves in a vertical direction. The horizontal sweep-line determines a Horizontal Scan Order (HSO) of a virtual topological polygon and a set of distinct virtual topological polygons. This is further explained in conjunction with FIG. 3. The sweep-line may be a non-orthogonal sweep-line oriented at a non-orthogonal angle relative to the horizontal axis. The non-orthogonal sweep-line moves in a direction perpendicular to the non-orthogonal sweep-line.

In an embodiment of the invention, after scanning the plurality of polygons with a vertical sweep-line and a horizontal sweep-line, one or more virtual topological polygon and one or more sets of distinct virtual topological polygons are represented using a Vertical Scan Grid (VSG). This is further explained in detail in conjunction with FIG. 8.

In an embodiment of the invention, virtual topological polygons that have identical SO may be aggregated as Identical Scan Order Geometries (ISOGeoms). An ISOGeom comprises one of a set of virtual topological polygons and a plurality of sets of distinct virtual topological polygons. This is further explained in conjunction with FIG. 3.

After representing each virtual topological polygon by an SO, at step 204, the dimensional data corresponding to each virtual topological polygon is determined to form a plurality of sized polygons. A sized polygon includes the topological and dimensional information for a corresponding polygon and does not include the location information or the origin of the corresponding polygon. A sized polygon corresponds to a virtual topological polygon. The dimensional data for a virtual topological polygon may be generated by calculating a Dimension Vector (DV) for the virtual topological polygon. A DV for a virtual topological polygon specifies the location of a first vertex with respect to a second vertex in the virtual topological polygon. The second vertex may be encountered consecutive to the first vertex in the SO of the virtual topological polygon. The DV of a virtual topological polygon is combined with the SO of the virtual topological polygon to generate a corresponding sized polygon. This is further explained in conjunction with an exemplary embodiment given in FIG. 4. A set of sized polygons in which each sized polygon has same SO and DV is aggregated as congruent polygons. This is further explained in conjunction with FIG. 3.

At step 206, spatial data corresponding to each sized polygon is extracted to instantiate each sized polygons to generate a plurality of instantiated polygons. The spatial data for an instantiated polygon includes one or more of an orientation value, an origin of instantiation, and attribute information for the sized polygon. An orientation value of the instantiated polygon corresponds to one or more of a rotation and a reflection of the standard canonical orientation. Further, the origin of instantiation of an instantiated polygon places the sized polygon spatially, such that, the x and y co-ordinates of each vertex of a sized polygon are specified. The attribute information of an instantiated polygon includes a plurality of attributes corresponding to the instantiated polygon. An attribute of an instantiated polygon may be one or more of layer information, color information, data type information, and user-defined properties. The layer information specifies the layer in which the instantiated polygon is located, which is required if the geometrical layout design data is multilayered. Color information is useful for graphical tools that are using the geometrical layout design data. Further, data type information may be used to distinguish instantiated polygons that belong to the same layer and use different data types to differentiate among themselves based upon some other criteria. Additionally, user may specify some user-defined properties for an instantiated polygon. The user-defined properties may typically specify non-geometrical properties for the polygon, for example, the name of net, the resistance value, the capacitance value. These properties are usually called user-defined properties as there may not be a single standard way for treating these properties. Additionally, the user or the software applications are free to use these properties in one or more ways.

Therefore, an instantiated polygon includes location information or the origin of a corresponding sized polygon such that the sized polygon can be placed spatially and the x and y co-ordinates of the vertices of the sized polygon can be specified.

Figure 3:
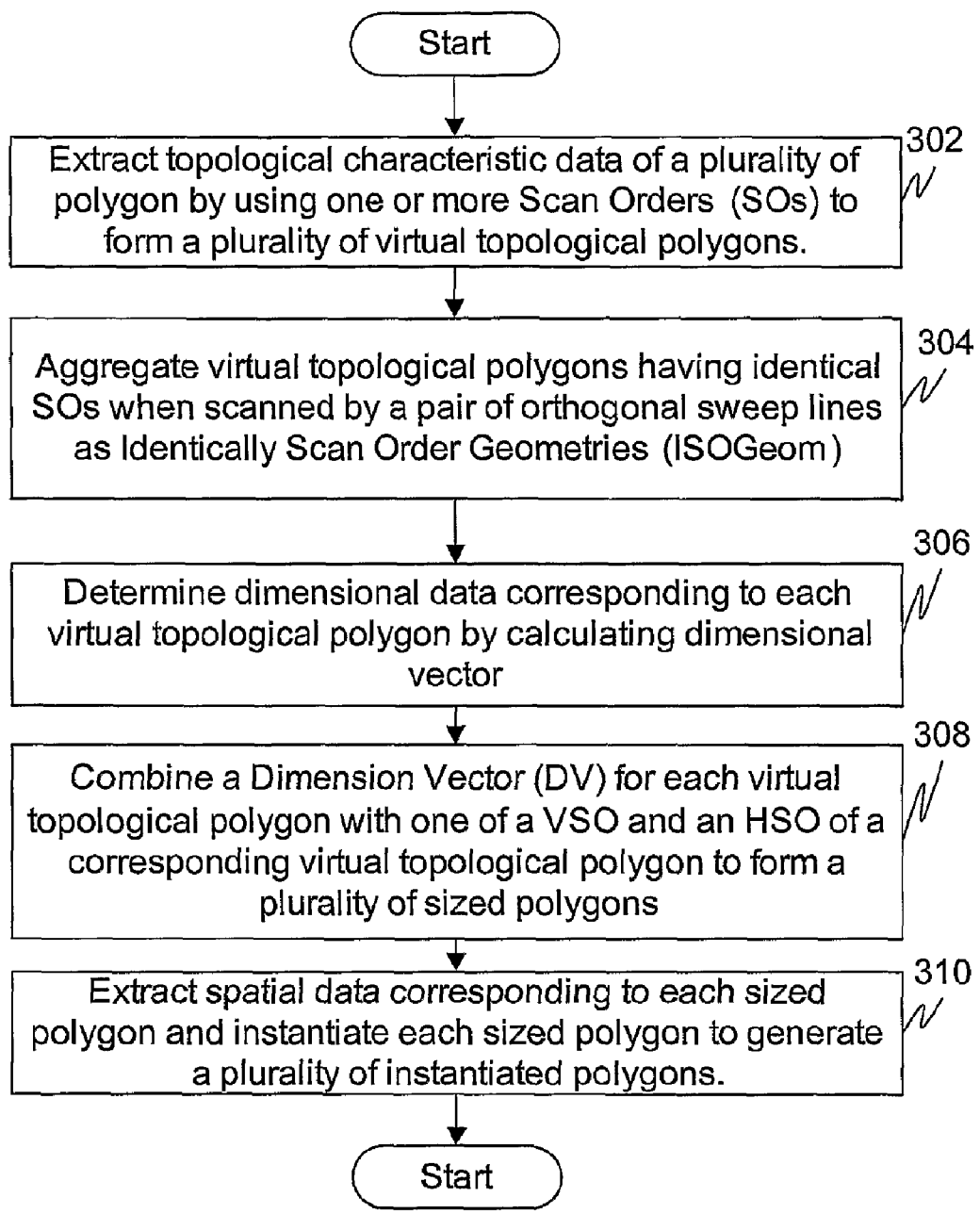
FIG. 3 is a flow chart for representing geometrical layout design data in electronic design systems using ISOGeoms represented by one or more of a VSO and an HSO, in accordance with an embodiment of the invention.

FIG. 3 is a flow chart for representing geometrical layout design data in electronic design systems using ISOGeoms represented by one or more of a VSO and an HSO, in accordance with an embodiment of the invention. At step 302, topological characteristics data corresponding to the plurality of polygons is extracted using one or more SOs to form a plurality of virtual topological polygons. A virtual topological polygon includes only the topological characteristics data for a corresponding polygon and does not include data for the size and the location of the corresponding polygon. Each virtual topological polygon is represented by one or more SOs. An SO of one or more virtual topological polygons corresponds to the order of vertices of the corresponding one or more polygons encountered by a sweep-line. This has been explained in conjunction with FIG. 2.

The sweep-line may be a vertical sweep-line moving in a horizontal direction. The vertical sweep-line determines a Vertical Scan Order (VSO) of a virtual topological polygon and a set of distinct virtual topological polygons. A VSO for a virtual topological polygon includes a plurality of displacement operators. A displacement operator specifies the order of encountering each vertex of a virtual topological polygon by a vertical sweep-line. In an embodiment of the invention, one or more displacement operators are used to separate a first vertex from a second vertex in a virtual topological polygon and specify orientation with respect to each other. For example, two displacement operators '+' and '*' are used to specify the orientation of a first vertex with respect to a second vertex using one of '+' and '*'. If a '+' is used to separate the first vertex and the second vertex, then it indicates that the first vertex and the second vertex are encountered by the vertical sweep-line at the same position of the sweep-line during the sweep. This implies that each of the first vertex and the second vertex have the same abscissa but different ordinates. Further, in this example, if a '*' is used to separate the first vertex and the second vertex, then it indicates that the first vertex and the second vertex are encountered by the vertical sweep-line at different positions of the sweep-line during the sweep. This implies that the first vertex and the second vertex have different abscissa. However, the ordinate may or may not be the same for the first vertex and the second vertex. This is further explained in detail in conjunction with FIG. 4.

A VSO of the virtual topological polygon may be represented using a plurality of sets of directional pattern bits and a vertices list. Each set of directional pattern bits corresponds to direction of the first vertex with respect to the second vertex of a virtual topological polygon. The vertices list corresponds to the order of vertices represented by the VSO of the virtual topological polygon. In an exemplary embodiment of the invention, if the second vertex is consecutive to the first vertex and is separated by the '+' operator from the first vertex in a VSO, it indicates that the first vertex and the second vertex have the same abscissa and the first vertex has a lower ordinate than the second vertex. In this case, a directed chord from the first vertex to the second vertex is '↑' (North), which corresponds to a set of directional pattern bits "00". However, if the second vertex is consecutive to the first vertex and is separated by the '*' operator from the first vertex in the VSO, it indicates the first vertex and the second vertex have different abscissa and the first vertex has a lower abscissa as compared to the second vertex. Hence, a directional chord from the first vertex to the second vertex may be one of '→' (East) that corresponds to a set of directional pattern bits "01", '↗' (North-east) that corresponds to a set of directional pattern bits "10" and '↘' (South-east) that corresponds to a set of direction pattern bits "11". The vertices list for a VSO is called a VSO Vertices List (VVL). The VVL for the virtual topological polygon is represented [first vertex, second vertex]. This is further explained in conjunction with FIG. 4. Representing VSO using the plurality of sets of directional pattern bits and a vertices list reduces the memory required for storing the topological characteristics data.

The sweep-line may be a horizontal sweep-line, which is aligned with the horizontal axis, and moves in a vertical direction. The horizontal sweep-line determines a Horizontal Scan Order (HSO) of a virtual topological polygon and a set of distinct virtual topological polygons. An HSO for a virtual topological polygon includes the plurality of displacement operators. A displacement operator specifies order of encountering each vertex of a virtual topological polygon by a horizontal sweep-line. As an example similar to the example given above for a VSO, two displacement operators '+' and '*' are used to specify the orientation of the first vertex with respect to the second vertex using one of '+' and '*'. If a '+' is used to separate the first vertex and the second vertex, then it indicates that the first vertex and the second vertex are encountered by the horizontal sweep-line at the same position of the sweep-pine during the sweep. This implies that each of the first vertex and the second vertex have the same ordinate but different abscissa. Further, in this example, if a '*' is used to separate the first vertex and the second vertex, then it indicates that the first vertex and the second vertex are encountered by the horizontal sweep-line at different positions of the sweep-line during the sweep. This implies that the first vertex and the second vertex have different ordinates. However, the abscissa may or may not be the same for the first vertex and the second vertex. This is further explained in detail in conjunction with FIG. 4.

A HSO of the virtual topological polygon may be represented using the plurality of sets of directional pattern bits and the vertices list. Each set of directional pattern bits corresponds to direction of the first vertex with respect to the second vertex of a virtual topological polygon. The vertices list corresponds to the order of vertices represented by the HSO of the virtual topological polygon. In an exemplary embodiment of the invention, if the second vertex is consecutive to the first vertex and is separated by the '+' operator from the first vertex in an HSO, it indicates that the first vertex and the second vertex have the same ordinate and the first vertex has a lower abscissa than the second vertex. In this case, a directed chord from the first vertex to the second vertex is (East), which corresponds to a set of directional pattern bits "00". However, if the second vertex is consecutive to the first vertex and is separated by the '*' operator from the first vertex in the VSO, it indicates the first vertex and the second vertex have different ordinates and the first vertex has a lower ordinate as compared to the second vertex. Hence, a directional chord from the first vertex to the second vertex may be one of '↑' (North) that corresponds to a set of directional pattern bits "01", '↗' (North-east) that corresponds to a set of directional pattern bits "11" and '↖' (North-west) that corresponds to a set of direction pattern bits "10". The vertices list for a HSO is called a HSO Vertices List (HVL). The HVL for the virtual topological polygon is represented as [first vertex, second vertex]. This is further explained in conjunction with FIG. 4. Representing HSO using the plurality of sets of directional pattern bits and a vertices list reduces the memory required for storing the topological characteristics data.

At step 304, virtual topological polygons having identical SOs are aggregated as ISOGeoms. An ISOGeom includes one of a set of virtual topological polygons and a plurality of sets of distinct virtual topological polygons. In the set of virtual topological polygons, each virtual topological polygon corresponds to one or more of a rotation and a reflection of a standard canonical orientation for the set of virtual topological polygons. Further, each virtual topological polygon, if oriented to generate the standard canonical orientation for the set of virtual topological polygons has the same SO as determined by a first sweep-line and the same SO as determined by a second sweep-line. The first sweep-line is orthogonal to the second sweep-line.

In an embodiment of the invention, the first sweep-line is the vertical sweep-line and the second sweep-line is the horizontal sweep-line. Therefore, in this case each virtual topological polygon in the set of virtual topological polygons in an ISOGeom has the same VSO and the same HSO. The rotations in this case may be along one or more of 0 degree, 90 degree, 180 degree, and 270 degree and the reflection may be along X axis and Y axis. Therefore, the set of virtual topological polygons in the ISOGeom has eight virtual topological polygons, one of which is a standard canonical orientation and other seven virtual topological polygons are orientations of the standard canonical orientation. The ISOGeom may be represented by each of a plurality of directional pattern bits corresponding to the VSO, the VVL, a plurality of directional pattern bits for the HSO, and the HVL of a standard canonical orientation of the ISOGeom. This is further explained in detail in conjunction with FIG. 7.

Similarly, if the ISOGeom includes a plurality of sets of distinct virtual topological polygons, each set of distinct virtual topological polygons corresponds to one or more of a rotation and a reflection of a standard canonical orientation for the plurality of sets of distinct topological polygons. Each distinct virtual topological polygon in a set of distinct virtual topological polygons has a dissimilar SO. Further, each set of distinct virtual topological polygons, if oriented to generate the standard canonical orientation for the plurality of sets of distinct virtual topological polygons has the same SO as determined by the first sweep-line and the same SO as determined by the second sweep-line. In an embodiment of the invention, the first sweep-line is the vertical sweep-line and the second sweep-line is the horizontal sweep-line. Therefore, in this case each set of distinct virtual topological polygon in the plurality of sets of virtual topological polygons has the same VSO and the same HSO.

In an embodiment of the invention, virtual topological polygons and sets of distinct virtual topological polygons that have same VSO and same HSO may be aggregated as a Horizontally and Vertically Identical Scan Ordered Geometries (HVISOGeom). In another embodiment of the invention, virtual topological polygons that have same VSO and the set of distinct virtual topological polygons that have same VSO may be aggregated as a Vertically Similar Scan Ordered Geometries (VSSOGeom) and the virtual topological polygons and the set of distinct virtual topological polygons that have same HSO may be aggregated as a Horizontally Similar Scan Ordered Geometries (HSSOGeom). Each virtual topological polygon in a VSSOgeom can be fractured into same number of trapezoids using a vertical sweep-line. However, each virtual topological polygon in the VSSOgeom may not be fractured into same number of trapezoids using a horizontal sweep-line, as one or more virtual topological polygon in the VSSOgeom may have different HSO. Similarly, each virtual topological polygon in an HSSOgeom can be fractured into same number of trapezoids using a horizontal sweep-line. However, each virtual topological polygon in the HSSOGeom may not be fractured into the same number of trapezoids using a vertical sweep-line, as one or more virtual topological polygons in the HSSOGeom may have different VSO. An HSSOGeom may be aggregated with a VSSOGeom to generate an HVISOGeom, such that virtual topological polygons represented by the HVISOGeom are also represented by each of the HSSOGeom and the VSSOGeom. For example, an HSSOGeom represents 20 virtual topological polygons that have same HSO and a VSSOGeom represents 10 virtual topological polygons that have same VSO. Further, five virtual topological polygons are common to the HSSOGeom and the VSSOGeom and have same VSO and HSO. These five polygons may therefore be represented by an HVISOGeom.

At step 306, the dimensional data corresponding to each virtual topological polygon is determined. The dimensional data for a virtual topological polygon may be generated by calculating a DV for the virtual topological polygon. Thereafter, at step 308, the DV for each virtual topological polygon is combined with one of the VSO and the HSO of a corresponding virtual topological polygon to form a plurality of sized polygons. This is further explained in detail in conjunction with FIG. 4. A sized polygon includes the topological and dimensional information for a corresponding polygon and does not include the location information or the origin of the corresponding polygon. A plurality of DVs may be used to generate a set of congruent polygons from an ISOGeom.

At step 310, the spatial data corresponding to each sized polygon is extracted to instantiate the plurality of sized polygons and a plurality of instantiated polygons are generated by combining the spatial data corresponding to each sized polygon with the corresponding sized polygon. This is explained in detail in conjunction with FIG. 2.

Figure 4:
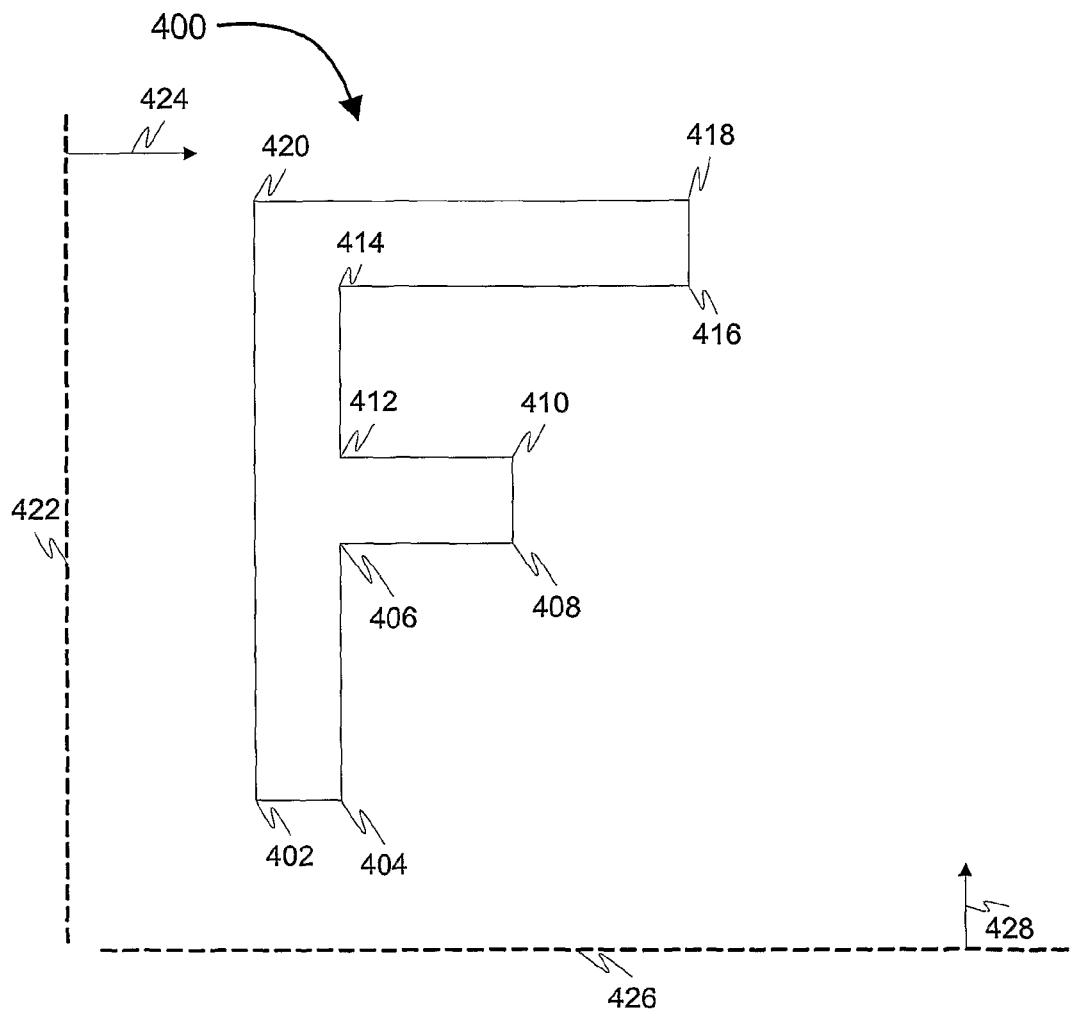
FIG. 4 is a block diagram showing representation of a polygon in the geometrical layout design data using each of a VSO and an HSO, in accordance with an embodiment of the invention.

FIG. 4 is a block diagram showing representation of a polygon 400 in the geometrical layout design data using each of a VSO and an HSO, in accordance with an embodiment of the invention. Polygon 400 has a vertex 402, vertex 404, vertex 406, vertex 408, vertex 410, vertex 412, vertex 414, vertex 416, vertex 418, and vertex 420. Topological characteristics data corresponding to polygon 400 is extracted and a corresponding virtual topological polygon is formed. To form the virtual topological polygon, polygon 400 is scanned by a sweep-line and the virtual topological polygon is represented using SO.

Polygon 400 may be scanned by a vertical sweep-line 422 which moves in a horizontal direction indicated by 424 and the virtual topological polygon corresponding to polygon 400 is therefore represented by a VSO. Vertical sweep-line 422 first encounters vertex 402 and vertex 420. Referring back to FIG. 3, the VSO for vertex 402 and vertex 420 is represented as [vertex 402+vertex 420]. Vertex 402 and vertex 420 are separated by operator '+' as each of vertex 402 and vertex 420 have the same abscissa. Further, vertex 420 is placed after vertex 402 in the VSO as vertex 420 has a greater ordinate than vertex 402. Thereafter, vertical sweep-line 422 encounters vertex 404, vertex 406, vertex 412, and vertex 414. The VSO is now represented as [vertex 402+vertex 420*vertex 404+vertex 406+vertex 412+vertex 414]. Vertex 420 and vertex 404 are separated by operator '*' as they have different abscissa. Additionally, vertex 404 is placed after vertex 420 in the VSO as abscissa of vertex 420 is less than the abscissa of vertex 404. Further, each of vertex 404, vertex 406, vertex 412, and vertex 414 has the same abscissa, therefore they are separated by '+' operator in the VSO and are placed in the order of increasing ordinates. At this stage of vertical sweep-line 422, the VSO is represented as [vertex 402+vertex 420*vertex 404+vertex 406+vertex 412+vertex 414].

Thereafter, vertical sweep-line 422 encounters vertex 408 and vertex 410 and the VSO is represented as [vertex 402+vertex 420*vertex 404+vertex 406+vertex 412+vertex 414*vertex 408+vertex 410]. Vertex 408 is separated from vertex 414 by operator '*' as they have different abscissa. Additionally, the vertex 408 is placed after vertex 414 as the abscissa of vertex 408 is greater than vertex 414. Additionally, vertex 408 is separated from vertex 410 by operator '+' as they have the same abscissa and are placed in the increasing order of ordinate. Further vertical sweep-line 422 encounters vertex 416 and vertex 418. The VSO is modified and is represented as [vertex 402+vertex 420*vertex 404+vertex 406+vertex 412+vertex 414*vertex 408+vertex 410*vertex 416+vertex 418]. Vertex 416 is separated from vertex 410 by operator '*' as they have different abscissa. Additionally, vertex 416 is placed after vertex 410 as the abscissa of vertex 416 is greater than vertex 410. Further, vertex 416 and vertex 418 are separated by operator '+' as they have same abscissa and are placed in increasing order of ordinate. The VSO for the virtual topological polygon for polygon 400 is represented by equation 1 given below:

VSO=[vertex 402+vertex 420*vertex 404+
vertex 406+vertex 412+vertex 414*vertex 408+
vertex 410*vertex 416+vertex 418]     (1)

The VSO may be represented using a plurality of sets of directional pattern bits and VVL to reduce the memory required to store topological characteristics data for polygon 400. Referring back to the FIG. 3, the set of direction pattern bits for vertex 420 relative to vertex 402 is "00" as they are separated by operator '+'. Similarly, the set of direction pattern bits for vertex 406 relative to vertex 404, vertex 412 relative to vertex 406, vertex 414 relative to vertex 412, vertex 410 relative to vertex 408, and vertex 418 relative to vertex 416 is represented as "00". Further, the set of direction pattern bits for vertex 404 relative to vertex 420 is "11", as vertex 404 is separated from vertex 420 by operator "*" and is in a south-east direction relative to vertex 420. Similarly, the set of directional pattern bits for vertex 408 relative to vertex 414 is "11". Further, the set of directional pattern bits for vertex 416 relative to vertex 410 is "10", as the vertex 416 is separated from vertex 410 by operator '*' and vertex 416 is in a north-east direction relative to vertex 410. The plurality of sets of directional pattern bits for the VSO is therefore represented by equation 2 given below:

DP(V)=00 11 00 00 00 11 00 10 00     (2)

Further, the VVL is represented corresponding to the order of vertices placed in the VSO. The VVL is represented by equation 3 given below:

VVL=[vertex 402, vertex 420, vertex 404, vertex 406,
vertex 412, vertex 414, vertex 408, vertex 410,
vertex 416, vertex 418]     (3)

After determining the VSO for polygon 400, DV (V) associated with the VSO is determined for polygon 400. DV (V) for polygon 400 includes displacement value for each vertex of polygon 400 relative to a preceding vertex as placed in the VSO. Displacement value for vertex 420 relative to vertex 402 is represented as (0, 7), as each of vertex 420 and vertex 402 have the same abscissa and the difference between their ordinates is equal to seven units. Further, displacement value of vertex 404 relative to vertex 420 is represented as (1,−7) as the difference between the abscissa is one and the difference between ordinates is −7. Similarly, displacement value of each of vertex 406 relative vertex 404 is represented as (0, 3), vertex 412 relative to vertex 406 is represented as (0, 1), vertex 414 relative to vertex 412 is represented as (0, 2), vertex 408 relative to vertex 414 is represented as (2, −3), vertex 410 relative to vertex 408 is represented as (0, 1), vertex 416 relative to vertex 410 is represented as (2, 2), vertex 418 relative to vertex 416 is represented as (0, 1). DV (V) for polygon 400, in which displacement values for the vertices of polygon 400 are placed corresponding to the order of the vertices placed in the VSO of polygon 400, is represented by equation 4 given below:

DV(V)=[(7);(1,−7);(3);(1);(2);(2,−3);(1);(2,2);(1)]     (4)

To generate a sized polygon for the virtual topological polygon corresponding to polygon 400, the VSO of polygon 400 is combined with DV (V). Therefore, the dimension of each edge of polygon 400 can be determined by combining the expression given in equation 1 and the expression given in equation 4. Thereafter, the spatial data is extracted for the sized polygon and the origin or the X and the Y co-ordinates of vertex 402 are determined. The origin of vertex 402 may be determined as (0, 0), therefore in this case, based on the origin of vertex 402 and the DV (V) the X and Y co-ordinates of each vertex of polygon 400 are determined. Co-ordinates for vertex 420 is determined as (0, 7), for vertex 404 as (1, 0), for vertex 406 as (1, 3), for vertex 412 as (1, 4), for vertex 414 as (1, 6), for vertex 408 as (3, 3), for vertex 410 as (3, 4), for vertex 416 (5, 6), and for vertex 418 as (5, 7). Polygon 400 is therefore now ready to be instantiated and can be placed spatially along the X axis and the Y axis.

Alternatively, polygon 400 may be scanned by a horizontal sweep-line 426 which moves in a vertical direction indicated by 428 to represent the virtual topological polygon corresponding to polygon 400 by an HSO. Horizontal sweep-line 426 first encounters vertex 402 and vertex 404. Referring back to FIG. 3, the HSO for vertex 402 and vertex 404 is represented as [vertex 402+vertex 404]. Vertex 402 and vertex 404 are separated by operator '+' as each of vertex 402 and vertex 404 have the same ordinate. Further, vertex 404 is placed after vertex 402 in the HSO, as vertex 404 has a greater abscissa than vertex 402. Thereafter, horizontal sweep-line 426 encounters vertex 406 and vertex 408. The HSO is now represented as [vertex 402+vertex 404*vertex 406+vertex 408]. Vertex 406 and vertex 404 are separated by operator '*' as they have different ordinates. Additionally, vertex 406 is placed after vertex 404 in the HSO as ordinate of vertex 404 is less than the ordinate of vertex 406. Further, each of vertex 406 and vertex 408 have the same ordinate, therefore they are separated by '+' operator in the HSO and are placed in the order of increasing abscissa.

Thereafter, horizontal sweep-line 426 encounters vertex 412 and vertex 410. The HSO is now represented as [vertex 402+vertex 404*vertex 406+vertex 408*vertex 412+vertex 410]. Vertex 412 is separated from vertex 408 by operator '*' as they have different ordinates. Additionally, the vertex 412 is placed after vertex 408 as the ordinate of vertex 412 is greater than vertex 408. Further, vertex 410 is separated from vertex 412 by operator '+' as they have the same ordinate and are placed in the increasing order of abscissa. Further, horizontal sweep-line 426 encounters vertex 414 and vertex 416. The HSO is modified and is represented as [vertex 402+vertex 404*vertex 406+vertex 408*vertex 412+vertex 410*vertex 414+vertex 416]. Vertex 414 is separated from vertex 410 by operator '*' as they have different ordinate. Additionally, vertex 414 is placed after vertex 410 as the ordinate of vertex 414 is greater than vertex 410. Additionally, vertex 416 is separated from vertex 414 by operator '+' as they have the same ordinate and are placed in the increasing order of abscissa. Further horizontal sweep-line 426 encounters vertex 420 and vertex 418. The HSO is modified and is represented as [vertex 402+vertex 404*vertex 406+vertex 408*vertex 412+vertex 410*vertex 414+vertex 416*vertex 420+vertex 418]. Vertex 420 is separated from vertex 416 by operator '*' as they have different ordinate. Additionally, vertex 420 is placed after vertex 416 as the ordinate of vertex 420 is greater than vertex 416. Additionally, vertex 418 is separated from vertex 420 by operator '+' as they have the same ordinate and are placed in the increasing order of abscissa. The HSO for the virtual topological polygon for polygon 400 is represented by equation 5 given below:

HSO=[vertex 402+vertex 404*vertex 406+
vertex 408*vertex 412+vertex 410*vertex 414+
vertex 416*vertex 420+vertex 418]       (5)

Similar to the VSO, the HSO may also be represented using a plurality of sets of directional pattern bits and HVL to reduce the memory required to store topological characteristics data for polygon 400. Referring back to the FIG. 3, the set of direction pattern bits for vertex 404 relative to vertex 402 is "00" as they are separated by operator '+'. Similarly, the set of direction pattern bit for vertex 408 relative to vertex 406, vertex 410 relative to vertex 412, vertex 416 relative to vertex 414, and vertex 418 relative to vertex 420 is represented as "00". Further, the set of direction pattern bits for vertex 406 relative to vertex 404 is "01", as vertex 406 is separated from vertex 404 by operator "*" and is in the north direction relative to vertex 404. Further, the set of directional pattern bits for vertex 412 relative to vertex 408 is "10" as the vertex 412 is separated from the vertex 408 by and is in the north-west direction relative to vertex 408. Similarly, the set of directional pattern bits for vertex 414 relative to vertex 410, and vertex 420 relative to vertex 416 is represented as "10". The plurality of sets of directional pattern bits for the HSO is therefore represented by equation 6 given below:

DP(H)=00 01 00 10 00 10 00 10 00       (6)

Further, the HVL is represented corresponding to the order of vertices placed in the HSO. The HVL is represented by equation 7 given below:

HVL=[vertex 402, vertex 404, vertex 406, vertex 408,
vertex 412, vertex 410, vertex 414, vertex 416,
vertex 420, vertex 418]       (7)

After determining the HSO for polygon 400, DV (H) associated with the HSO is determined for polygon 400. DV (H) for polygon 400 includes displacement value for each vertex of polygon 400 relative to a preceding vertex as placed in the HSO. Displacement value for vertex 404 relative to vertex 402 is represented as (1, 0), as each of vertex 402 and vertex 404 have the same ordinate and the difference between their abscissa is equal to one unit. Further, displacement value of vertex 406 relative to vertex 404 is represented as (0, 3) as the difference between the ordinate is three units and they have same abscissa. Similarly, displacement value of each of vertex 408 relative to vertex 406 is represented as (2, 0), vertex 412 relative to vertex 408 is represented as (-2, 1), vertex 410 relative to vertex 412 is represented as (2, 0), vertex 414 relative to vertex 410 is represented as (-2, 2), vertex 416 relative to vertex 414 is represented as (4, 0), vertex 420 relative to vertex 416 is represented as (-5, 1), vertex 418 relative to vertex 420 is represented as (5, 0). DV (H) for polygon 400, in which displacement values for vertices are placed corresponding to the order of the vertices placed in the HSO of polygon 400, is represented by equation 8 given below:

DV(H)=[(1);(3);(2);(-2, 1);(2);(-2,2);(4);(-5,1);(5)]       (8)

To generate a sized polygon for the virtual topological polygon corresponding to polygon 400, the HSO of polygon 400 may be combined with DV (H). Therefore, the dimension of each edge of polygon 400 can be determined by combining the expression given in equation 5 and the expression given in equation 8. Further, the spatial data is extracted for the sized polygon and the origin or the X and the Y co-ordinates of vertex 402 are determined. The origin of vertex 402 may be determined as (0, 0), therefore in this case, based on the origin of vertex 402 and the DV (H) given in equation 8, the X and Y co-ordinates of each vertex of polygon 400 are determined. Co-ordinates for vertex 420 is determined as (0, 7), for vertex 404 as (1, 0), for vertex 406 as (1, 3), for vertex 412 as (1, 4), for vertex 414 as (1, 6), for vertex 408 as (3, 3), for vertex 410 as (3, 4), for vertex 416 as (5, 6), and for vertex 418 as (5, 7). Polygon 400 is therefore now ready to be instantiated and can be placed spatially along the X axis and the Y axis.

Figure 5:
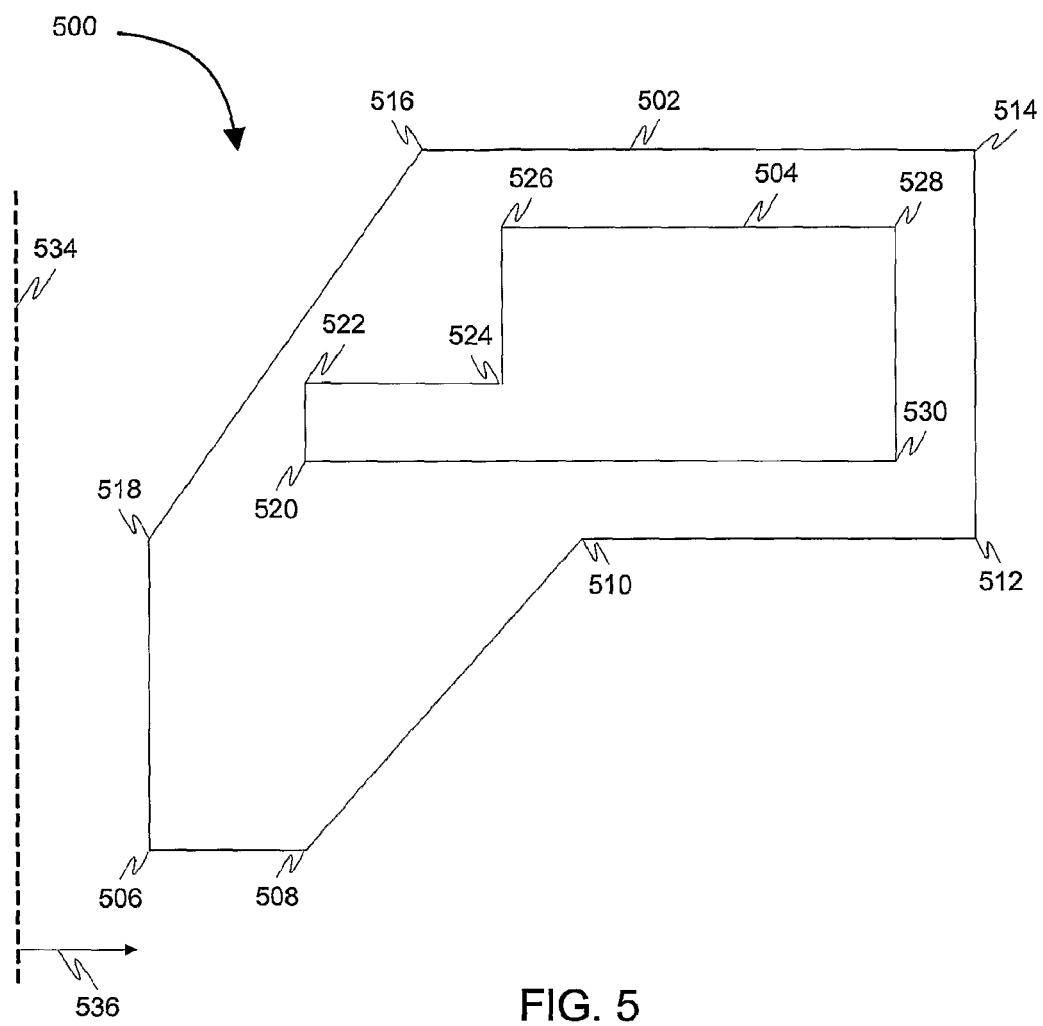
FIG. 5 is a block diagram showing representation of a hole-polygon in the geometrical layout design data using a VSO, in accordance with an exemplary embodiment of the invention.

FIG. 5 is a block diagram showing representation of a hole-polygon 500 in the geometrical layout design data using a VSO, in accordance with an exemplary embodiment of the invention. Hole-polygon 500 corresponds to a filled polygon 502 and an unfilled polygon 504. Filled polygon 502 includes unfilled polygon 504. Topological characteristics data corresponding to hole-polygon 500 is extracted and a corresponding virtual topological hole-polygon is formed. To form the virtual topological hole-polygon, hole-polygon 500 is scanned by a sweep-line and the virtual topological hole-polygon is represented using SO. SO is calculated in the same manner as explained in FIG. 4 for polygon 400. In accordance with an exemplary embodiment of the invention, filled polygons are numbered in counter clockwise direction and unfilled polygons are numbered in clockwise direction. The vertices of filled polygon 502 are numbered before numbering the vertices of unfilled polygon 504, as the sweep-line encounters filled polygon 502 before unfilled-polygon 504. Filled-polygon 502 is numbered in a counter clockwise direction, while unfilled-polygon 504 is numbered in a clockwise direction. Filled-polygon 502 has a vertex 506, a vertex 508, a vertex 510, a vertex 512, a vertex 514, a vertex 516, and a vertex 518 and unfilled-Polygon 504 has a vertex 520, a vertex 522, a vertex 524, a vertex 526, a vertex 528, and a vertex 530. It will be apparent to people skilled in the art that hole-polygon 500 may also be represented similarly using an HSO.

Hole-polygon 500 is scanned by a vertical sweep-line 534 which moves in a horizontal direction indicated by 536 to represent the virtual topological polygon corresponding to hole-polygon 500 by a VSO. Referring back to FIG. 4, the VSO for hole-polygon 500 may be calculated in the same manner as that for polygon 400, however, in the VSO for hole-polygon 500 the vertices of unfilled-polygon 504 are assigned a negative sign to indicate that they correspond to an unfilled polygon. Therefore, the VSO for hole-polygon 500 determined by vertical sweep-line 532 is represented by equation 9 given below:

$$\text{VSO}=[\text{vertex 506}+\text{vertex 518}*\text{vertex 508}+ \\ (-\text{vertex 520})+(-\text{vertex 522})*\text{vertex 516}* \\ (-\text{vertex 524})+(-\text{vertex 526})*\text{vertex 510}* \\ (-\text{vertex 530})+(-\text{vertex 528})*\text{vertex 512}+ \\ \text{vertex 514}] \quad (9)$$

The VSO for hole-polygon 500 may be represented using a plurality of sets of directional pattern bits and a VVL to reduce the memory required to store topological characteristics data. Referring back to FIG. 3 and FIG. 4, the set of direction pattern bits and the VVL for the hole-polygon 500 are calculated and represented by equations 10 and 11 given below.

$$\text{DP(V)}=00\ 11\ 00\ 00\ 10\ 11\ 00\ 11\ 10\ 00\ 11\ 00 \quad (10)$$

$$\text{VVL}=[\text{vertex 506},\text{vertex 518},\text{vertex 508},(-\text{vertex} \\ 520),(-\text{vertex 522}),\text{vertex 516},(-\text{vertex 524}), \\ (-\text{vertex 526}),\text{vertex 510},(-\text{vertex 530}), \\ (-\text{vertex 528}),\text{vertex 512},\text{vertex 514}] \quad (11)$$

After determining the VSO for hole-polygon 500, DV (V) associated with the VSO is determined for hole-polygon 500. DV (V) for hole-polygon 500 includes displacement value for each vertex of hole-polygon 500 relative to a preceding vertex as placed in the VSO for hole-polygon. Referring back to FIG. 3 and FIG. 4, the DV (V) for hole-polygon 500, in which displacement value for the vertices of hole-polygon 500 are placed corresponding to the order of the vertices placed in the VSO of hole-polygon 500, is determined and represented by equation 12 given below:

$$\text{DV(V)}=[(4);(2,-4);(5);(1);(1,3);(1,-3);(2);(1,-4); \\ (5,1);(3);(1,-4);(5)]. \quad (12)$$

Hole-polygon 500 is further associated with a hole-Vertex Count Vector (hole-VCV), which includes one or more elements corresponding to filled-polygon 502 and unfilled-polygon 504. The number of elements in a hole-VCV corresponds to the total number of polygons in hole-polygon 500. Therefore, the hole-VCV for hole-polygon 500 has two elements. The first element in the hole-VCV corresponds to filled-polygon 502 and the second element corresponds to unfilled-polygon 504. Further, each element in a hole-VCV denotes the number of vertices in the corresponding polygon and each element is associated with either a negative sign or a positive sign. An element with a positive sign corresponds to a filled polygon and an element with negative sign corresponds to an unfilled polygon. As filled-polygon 502 has seven vertices and unfilled-polygon 504 has six vertices, therefore, the first element of the hole-VCV is represented as '+7' and the second element is represented as '−6'. The hole-VCV for hole-polygon is therefore represented by equation 13 given below:

$$\text{Hole-VCV}=[7,-6] \quad (13)$$

To generate a sized hole-polygon corresponding to hole-polygon 500, the VSO of hole-polygon 500 is combined with DV (V). Thus the dimension of each edge of hole-polygon 500 can be determined by combining the expression given in equation 9 and the expression given in equation 12. Thereafter, the spatial data is extracted for the sized hole-polygon 500 and origin or the X and Y co-ordinates of vertex 506 are determined. Thereafter, based on the origin of vertex 506 and the DV (V), the X and Y co-ordinates of each vertex of hole-polygon 500 are determined. This has been explained in conjunction with FIG. 4. Hole-polygon 500 is therefore now ready to be instantiated and can be placed spatially along the X axis and the Y axis.

Figure 6:
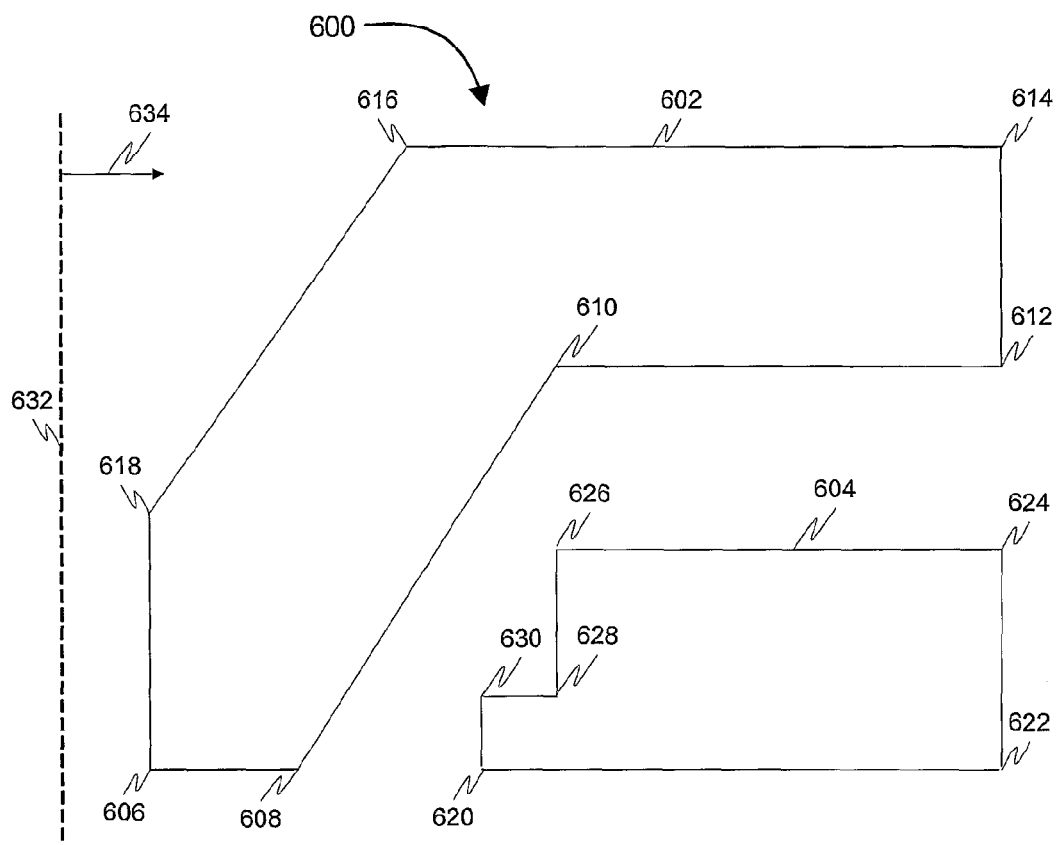
FIG. 6 is a block diagram showing representation of a set of distinct polygons in the geometrical layout design data using a VSO, in accordance with an exemplary embodiment of the invention.

FIG. 6 is a block diagram showing representation of a set of distinct polygons 600 in the geometrical layout design data using a VSO, in accordance with an exemplary embodiment of the invention. Set of distinct polygons 600 corresponds to distinct polygons, i.e., polygon 602 and polygon 604. Topological characteristics data corresponding to set of distinct polygons 600 is extracted and a corresponding set of distinct virtual topological polygons is formed. To form the set of distinct virtual topological polygons, set of distinct polygons 600 is scanned by a sweep-line and the set of distinct virtual topological polygons is represented using a SO. The SO is calculated in the same manner as explained in FIG. 4 for polygon 400. The vertices of polygon 602 are numbered before numbering the vertices of polygon 604, as the sweep-line encounters polygon 602 before polygon 604. Further, the vertices of each of polygon 602 and polygon 604 are numbered in a counter clockwise order. Polygon 602 has a vertex 606, a vertex 608, a vertex 610, a vertex 612, a vertex 614, a vertex 616, and a vertex 618 and polygon 604 has a vertex 620, a vertex 622, a vertex 624, a vertex 626, a vertex 628, and a vertex 630. It will be apparent to people skilled in the art that set of distinct polygons 600 may also be represented similarly using an HSO.

In this exemplary embodiment, the set of distinct polygons 600 is scanned by a vertical sweep-line 632 which moves in a horizontal direction indicated by 634 to represent the set of distinct virtual topological polygons corresponding to set of distinct polygons 600 by a VSO. Referring back to FIG. 4, the VSO for set of distinct polygons 600 may be determined in the same manner as that for polygon 400. Therefore, the VSO for set of distinct polygons 600 is represented by equation 14 given below:

$$\text{VSO}=[\text{vertex 606}+\text{vertex 618}*\text{vertex 608}* \\ \text{vertex 616}*\text{vertex 620}+\text{vertex 630}*\text{vertex 628}+ \\ \text{vertex 626}+\text{vertex 610}*\text{vertex 622}+\text{vertex 624}+ \\ \text{vertex 612}+\text{vertex 614}] \quad (14)$$

The VSO for set of distinct polygons 600 may be represented using a plurality of sets of directional pattern bits and a VVL to reduce the memory required to store topological characteristics data for set of distinct polygons 600. Referring back to FIG. 3 and FIG. 4, the set of direction pattern bits and the VVL for set of distinct polygons 600 are calculated and represented by equations 15 and 16 given below.

$$\text{DP(V)}=00\ 11\ 10\ 11\ 00\ 01\ 00\ 00\ 11\ 00\ 00\ 00 \quad (15)$$

$$\text{VVL}=[\text{vertex 606},\text{vertex 618},\text{vertex 608},\text{vertex 616}, \\ \text{vertex 620},\text{vertex 630},\text{vertex 628},\text{vertex 626}, \\ \text{vertex 610},\text{vertex 622},\text{vertex 624},\text{vertex 612}, \\ \text{vertex 614}] \quad (16)$$

After determining the VSO for set of distinct polygons 600, DV (V) associated with the VSO is determined for set of distinct polygons 600. DV (V) for the set of distinct polygons 600 includes displacement value for each vertex relative to a preceding vertex as placed in the VSO. Referring back to FIG. 3 and FIG. 4, the DV (V) for set of distinct polygons 600 in which displacement value for vertices are placed correspond- ing to the order of the vertices placed in the VSO of set of distinct polygons 600 is determined and represented by equation 17 given below:

$$DV(V)=[(6);(2,-6);(1,9);(1,-9);(1);(1,0);(2);(3);\\(6,-6);(3);(3);(3)] \qquad (17)$$

Set of distinct polygons 600 is further associated with a Vertex Count Vector (VCV) which includes one or more elements corresponding to each polygon in set of distinct polygons 600. The number of elements in a VCV corresponds to the total number of polygons in a set of distinct polygons. Therefore the VCV for set of distinct polygons 600 has two elements. The first element in the VCV of set of distinct polygons 600 corresponds to polygon 602 and the second element corresponds to polygon 604. Further, each element in a VCV denotes the number of vertices in the corresponding polygon.

Therefore, the first element of the VCV for set of distinct polygons 600 corresponding to polygon 602 has a value of '7' and the second element of the VCV for set of distinct polygons 600 corresponding to polygon 604 has a value of '6'. The VCV for set of distinct polygons 600 is therefore represented by equation 18 given below:

$$VCV=[7,6] \qquad (18)$$

To generate a set of distinct sized polygons corresponding to set of distinct polygons 600, the VSO of set of distinct polygons 600 is combined with DV (V). Thus the dimension of each edge of each polygon in the set of distinct polygons 600 can be determined by combining the expression given in equation 17 and the expression given in equation 14. The spatial data is extracted for the set of distinct polygons 600 and origin or the X and Y co-ordinates of vertex 606 are determined. Based on the origin of vertex 606 and the DV (V) the X and Y co-ordinates of each vertex of set of distinct polygons 600 are determined. Set of distinct polygons 600 is therefore now ready to be instantiated and can be placed spatially along the X axis and the Y axis.

Figure 7:
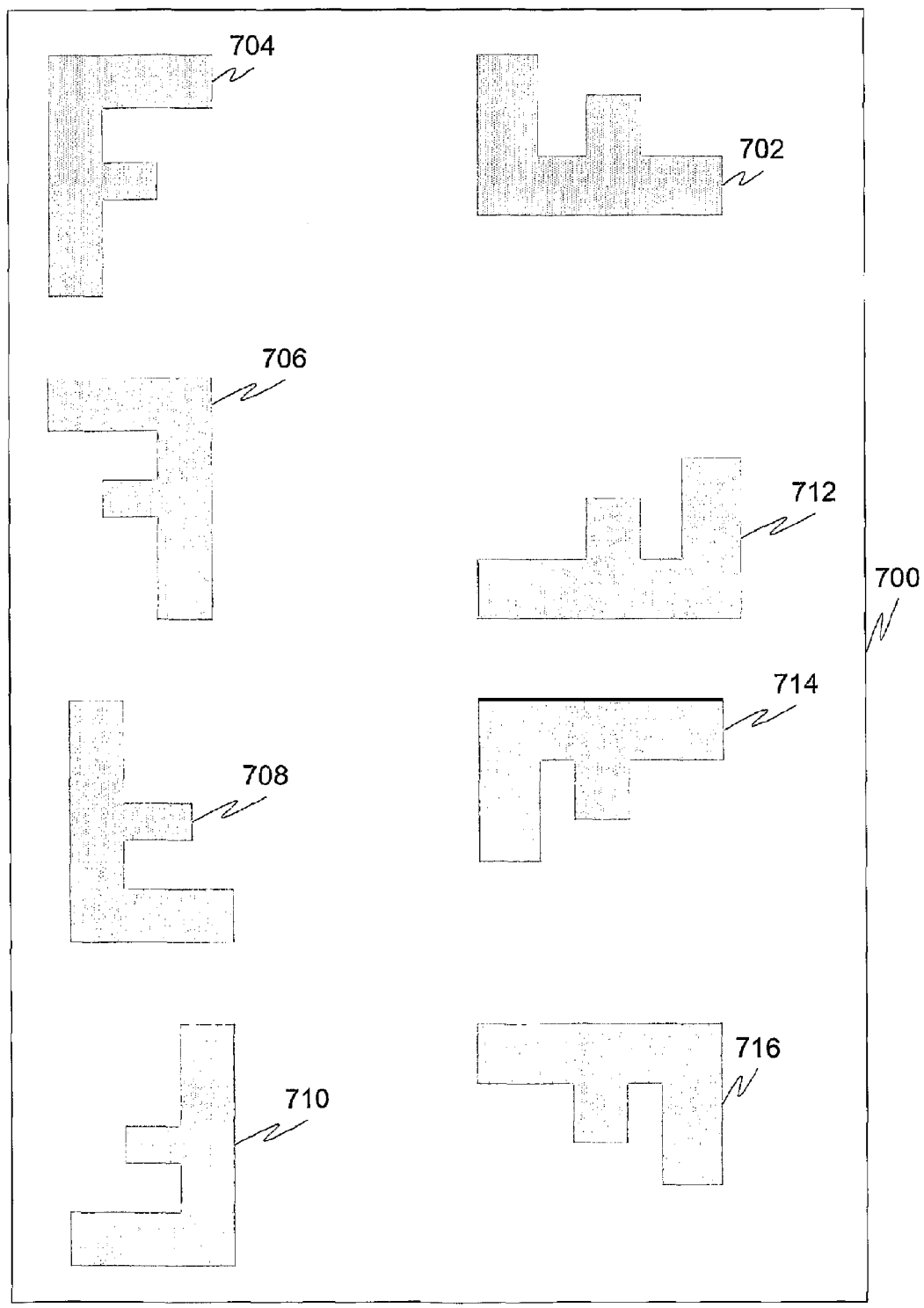
FIG. 7 is a block diagram showing a set of virtual topological polygons belonging to the same ISOGeom, in accordance with an exemplary embodiment of the invention.

FIG. 7 is a block diagram showing a set of virtual topological polygons belonging to an ISOGeom 700, in accordance with an exemplary embodiment of the invention. The set of virtual topological polygons includes a virtual topological polygon 702, a virtual topological polygon 704, a virtual topological polygon 706, a virtual topological polygon 708, a virtual topological polygon 710, a virtual topological polygon 712, a virtual topological polygon 714, and a virtual topological polygon 716. Virtual topological polygon 702 is a standard canonical orientation for ISOGeom 700. The standard canonical orientation is determined using a predefined method, in accordance with an exemplary embodiment of the invention.

Virtual topological polygon 702 corresponds to a polygon in geometrical layout design data, which is scanned by a vertical sweep-line and a horizontal sweep-line to determine SO of the polygon. Virtual topology polygon 702 is therefore represented by one or more of a VSO and an HSO. Further, as virtual topological polygon is represented by one or more of the VSO and the HSO, therefore, four rotations, i.e., along 0 degree, 90 degree, 180 degree, and 270 degree, and two reflections, i.e., along X axis and Y axis, are possible. Virtual topological polygon 702, therefore, has eight orientations including itself. Each of virtual topological polygon 704, virtual topological polygon 706, virtual topological polygon 708, virtual topological polygon 710, virtual topological polygon 712, virtual topological polygon 714, and virtual topological polygon 716 is an orientation of virtual topological polygon 702, i.e., one or more of a rotation and reflection of virtual topological polygon 702, such that, if each of these virtual topological polygon, if rotated to generate virtual topological polygon 702 has the same VSO and the same HSO as virtual topological polygon 702.

Virtual topological polygon 704 when rotated by angle of 90 degrees in counter clockwise direction generates virtual topological polygon 702, such that after such rotation, it has the same VSO and the same HSO as virtual topological polygon 702. Similarly, virtual topological polygon 706 when reflected along Y-Axis and further rotated by angle of 90 degrees in counter clockwise direction generates virtual topological polygon 702, such that after such rotation and reflection, it has the same VSO and the same HSO as virtual topological polygon 702. Similarly, virtual topological polygon 708 when rotated by angle of 90 degrees in clockwise direction and further, reflected along X-Axis to generate virtual topological polygon 702 has the same VSO and the same HSO as virtual topological polygon 702. Virtual topological polygon 710 when rotated by angle of 90 degrees in clockwise direction to generate virtual topological polygon 702 has the same VSO and the same HSO as virtual topological polygon 702. Virtual topological polygon 712 when reflected along Y-Axis to generate virtual topological polygon 702 has the same VSO and the same HSO as virtual topological polygon 702. Virtual topological polygon 714 when reflected along X-Axis to generate virtual topological polygon 702 has the same VSO and the same HSO as virtual topological polygon 702. Virtual topological polygon 716 when reflected along Y-Axis and further reflected along X-Axis to generate virtual topological polygon 702 has the same VSO and the same HSO as virtual topological polygon 702.

Figure 8:
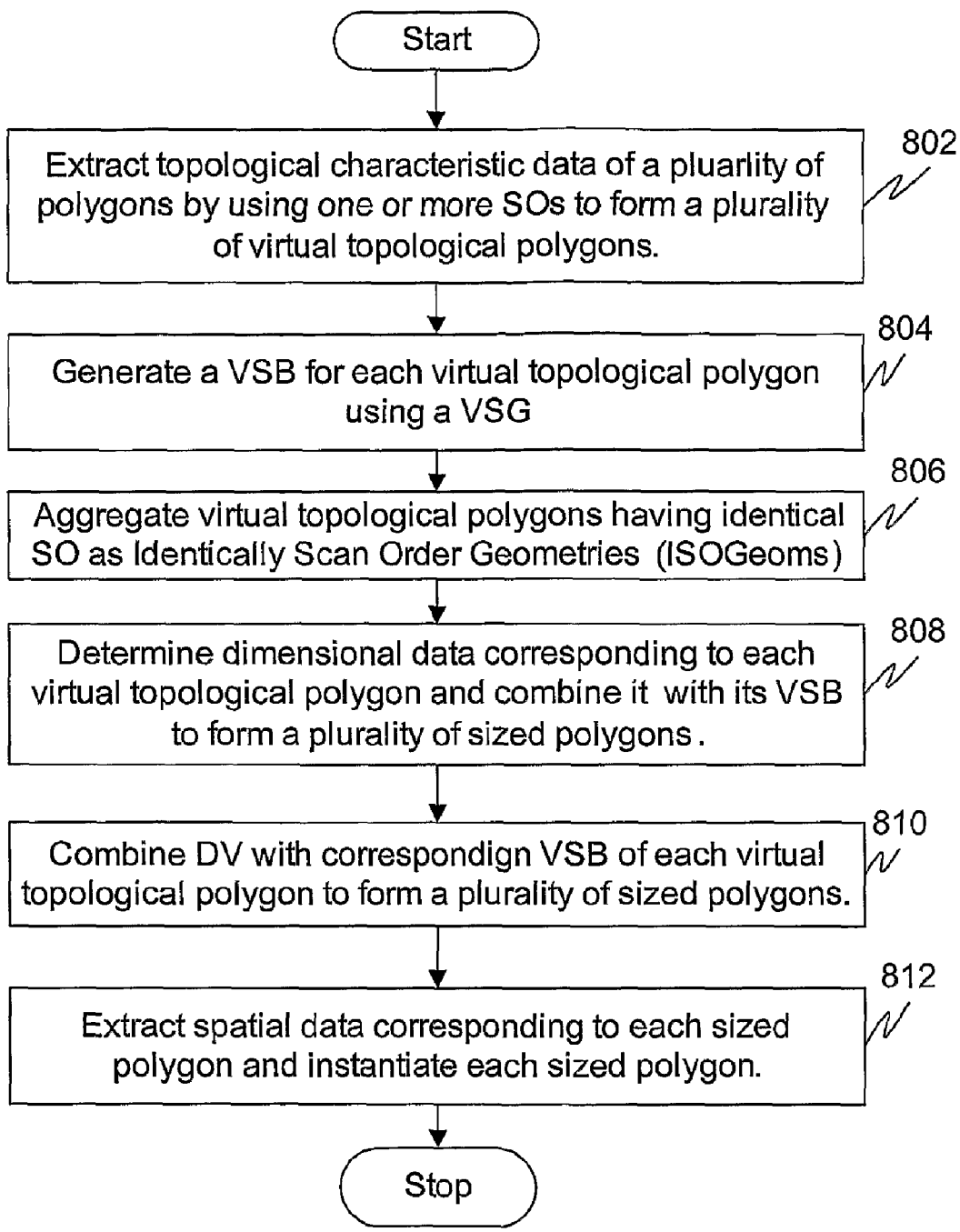
FIG. 8 is a flow chart for representing the geometrical layout design data in electronic design systems using a Variable Sized Grid (VSG), in accordance with an embodiment of the invention.

FIG. 8 is a flow chart for representing geometrical layout design data in electronic design systems using a Variable Sized Grid (VSG), in accordance with an embodiment of the invention. At step 802, topological characteristics data corresponding to the plurality of polygons is extracted to form a plurality of virtual topological polygons. A virtual topological polygon includes only the topological characteristics data for a corresponding polygon and does not include data for the size and the location of the corresponding polygon. Each virtual topological polygon is represented by one or more SOs. An SO of one or more virtual topological polygons corresponds to the order of vertices of the corresponding one or more polygons encountered by a sweep-line. The sweep-line may be one or more of a vertical sweep-line and a horizontal sweep-line.

After a polygon or a set of distinct polygons is scanned using each of the vertical sweep-line and the horizontal sweep-line and a corresponding virtual topological polygon or a corresponding sets of virtual topological polygons is formed, the polygon or the set of distinct polygons is divided into grids by horizontal grid lines and vertical grid lines. Therefore, the virtual topological polygon or the sets of distinct virtual topological polygons is represented by creating Variable Sized Grids (VSGs). A horizontal grid line passes horizontally through one or more vertices of a polygon and a vertical grid line passes vertically through one or more vertices of the polygon. Each vertex is passed through exactly by one horizontal grid line and exactly one vertical grid line. The VSG divides a virtual topological polygon into a first plurality of grids and a set of distinct virtual polygons into a second plurality of grids. Each grid in the first plurality of grids is one of completely occupied, partially occupied, and unoccupied by a portion of the virtual topological polygon. Similarly, each grid in the second plurality of grids is one of completely occupied, partially occupied, and unoccupied by a portion of a distinct virtual topological polygon in the set of distinct virtual topological polygons.

After creating a VSG for a virtual topological polygon and a set of distinct virtual topology polygon, at step 804 a Variable Sized Bitmap (VSB) is created for the virtual topology polygon and the set of distinct virtual topological polygons using a corresponding VSG. A VSB represents each of the first plurality of grids of the virtual topology polygon and the second plurality of grids of the set of distinct virtual topology polygons using a predefined notation. The predefined notation may be assigning a color code to a grid based on state of occupation of the grid. In an embodiment of the invention, the predefined notation may be assigning bits to a grid based on an occupied state of a grid. In another embodiment, the predefined notation may be assigning a combination of color code and bits. For example, a grid that is completely occupied by a portion of a virtual topological polygon may be colored black, a grid that is partially occupied by a portion of a virtual topological polygon may be partly colored black, and a grid that is unoccupied by a portion of a virtual topology polygon may be colored white. In another example where the grids can only be fully occupied or fully unoccupied, the black color may be replaced by bit value of '1' and the white color, may be replaced by a bit value of '0'. This is further explained in conjunction with exemplary embodiments of FIG. 9 and FIG. 10.

A virtual topological polygon and a set of distinct virtual topological polygons may be represented using a signature bitmap derived from a corresponding VSB. A signature bitmap represents a virtual topological polygon. Using signature bitmap for representing virtual topological data reduces the memory required to store topological characteristics data. A signature bitmap of a first virtual topological polygon may be processed to generate a signature bitmap for a second virtual topological polygon. Thereafter, the signature bitmap for the second virtual topological polygon may be used to generate the second virtual topological polygon. The signature bitmap, for example, may be processed by applying one or more operations such as Boolean operations on the signature bitmap. In an embodiment of the invention, each of the signature bitmap and the DV for the first virtual topological polygon may be processed together to generate the signature bitmap for the second virtual topological polygon. This is further explained in conjunction with exemplary embodiments given in FIG. 9 and FIG. 10.

At step 806, virtual topological polygons that have identical SOs are aggregated as an ISOGeom. An ISOGeom includes one of a set of virtual topological polygons and a plurality of sets of distinct virtual topological polygons. This has been explained in detail in conjunction with FIG. 3. In an embodiment of the invention, the ISOGeom includes the set of virtual topological polygons and a VSG divides each virtual topological polygon in the set of virtual topological polygons into a first plurality of grids. Each virtual topological polygon in the ISOGeom is represented using a signature bitmap derived from the corresponding VSB. Further, as each virtual topological polygon is one or more of a rotation and a reflection of a standard canonical orientation and as processing a signature bitmap for a first virtual topological polygon enables the generation of a second virtual topological polygon, therefore, signature bitmap of each virtual topological polygon in the set of virtual topological polygon may be rotated and/or reflected to generate the standard canonical orientation. The ISOGeom may be represented using the signature bitmap of the standard canonical orientation. The standard canonical orientation of the ISOGeom is based upon a predefined characteristic of the signature bitmap arranged in a predefined order. The standard canonical orientation of the ISOGeom may be determined by arranging a signature bitmap of each virtual topological polygon in the set of virtual topological polygon in a predefined order. In an exemplary embodiment of the invention, a virtual topological polygon that has highest numerical value for the signature bitmap arranged in the predefined order as compared to other virtual topological polygons in the set of virtual topological polygons can be considered as the signature bitmap of the standard canonical orientation of the ISOGeom and the correspondingly oriented virtual topological polygon can be considered as the standard canonical orientation for the virtual topological polygons in the set of virtual topological polygons in the ISOGeom. This is further explained in detail in conjunction with FIG. 9 and FIG. 10.

In another embodiment of the invention, an ISOGeom includes a plurality of sets of distinct polygons and a VSG divides each set of distinct virtual topological polygons into a second plurality of grids. Each set of distinct virtual topological polygons in the ISOGeom is represented using a signature bitmap derived from the corresponding VSB. Further, as each set of distinct virtual topological polygon is one or more of a rotation and a reflection of a standard canonical orientation and as processing a signature bitmap for a first set of distinct virtual topological polygons enables the generation of a second set of distinct virtual topological polygons, therefore, signature bitmap of each set of distinct virtual topological polygons in the plurality of sets of virtual topological polygons may be rotated and/or reflected to generate the standard canonical orientation.

At step 808, a dimensional data corresponding to each virtual topological polygon is determined to form a plurality of sized polygons. The dimensional data for a virtual topological polygon may be generated by calculating a DV for the virtual topological polygon. A DV specifies the dimensions for a virtual topological polygon to convert it into a sized polygon. The DV for a virtual topological polygon includes two direction specific vectors, i.e., DX and DY. DX corresponds to the number of vertical grid lines and DY corresponds to the number of horizontal grid lines. Further, the value of each element in DX specifies distance between two consecutive vertical grid lines and the value of each element in DY specifies distance between two consecutive horizontal grid lines. At step 810, the DV of the virtual topological polygon is combined with the VSB of the virtual topological polygon to create a sized polygon.

Using the signature bitmap representation for an ISOGeom and the corresponding dimension vectors, one or more geometric operations may be performed on the ISOGeom, such that, less memory is required and the geometric operations can be carried out fast. Examples, of one or more geometric operations include, but are not limited to Unary operations, resizing, bounding box, window query with clipping, finding canonical form for an ISOGeom.

At step 812, the spatial data corresponding to each sized polygon is extracted to instantiate the plurality of sized polygons. Thereafter, a plurality of instantiated polygons is generated by combining the spatial data corresponding to each sized polygon with the corresponding sized polygon. This has been explained in detail in conjunction with FIG. 2.

Figure 9:
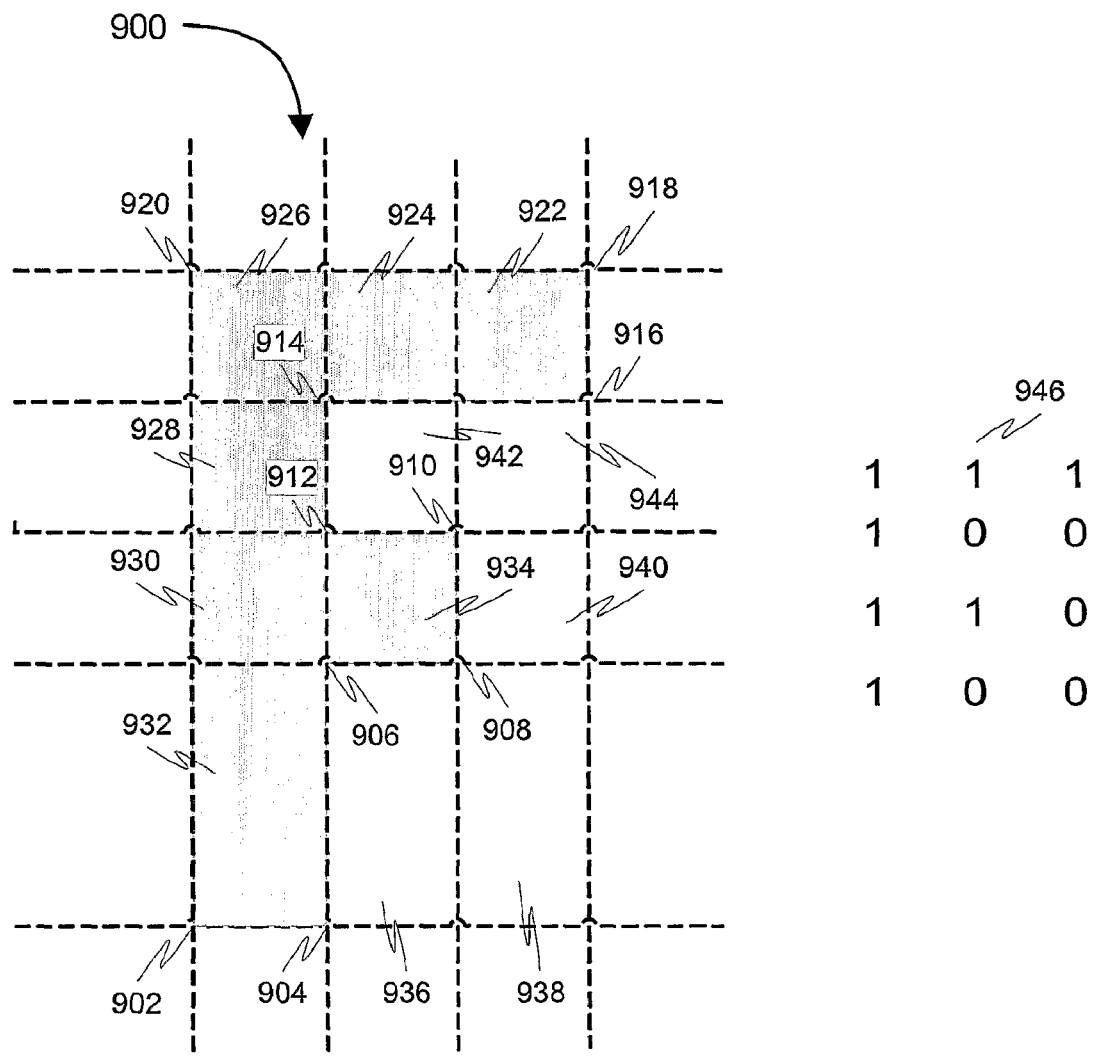
FIG. 9 is a block diagram showing representation of a manhattan polygon 900 in the geometrical layout design data using a VSG, in accordance with an exemplary embodiment of the invention.

FIG. 9 is a block diagram showing representation of a manhattan polygon 900 in the geometrical layout design data using a VSG, in accordance with an exemplary embodiment of the invention. In a manhattan polygon, each edge is orthogonal to one of the X axis and the Y axis. The vertices of Manhattan polygon 900 are numbered in counter-clockwise direction. Manhattan polygon 900 has a vertex 902, a vertex 904, a vertex 906, a vertex 908, a vertex 910, a vertex 912, a vertex 914, a vertex 916, a vertex 918, and a vertex 920.

Manhattan polygon 900 is scanned using a vertical sweep-line and a horizontal sweep-line to extract the topological characteristics data for manhattan polygon 900 to generate a corresponding virtual topological polygon. As a result of this, manhattan polygon 900 is divided into a plurality of grids by horizontal grid lines and vertical grid lines. Each horizontal grid line horizontally passes through one or more vertices of manhattan polygon 900 and each vertical grid line passes vertically though one or more vertices of manhattan polygon 900. Also, each vertex of manhattan polygon 900 is passed through exactly by one horizontal grid line and exactly by one vertical grid line. Therefore, a first vertical grid line passes through vertex 902 and vertex 920, a second vertical grid line passes through vertex 904, vertex 906, vertex 912, and vertex 914, a third vertical grid line passes through vertex 908 and vertex 910, and a fourth vertical grid line passes through vertex 916 and vertex 918. Similarly, a first horizontal grid line passes through vertex 902 and vertex 904, a second horizontal grid line passes through vertex 906 and vertex 908, a third horizontal grid line passes through vertex 912 and vertex 910, a fourth horizontal grid line passes though vertex 914 and vertex 916, and a fifth horizontal grid line passes though vertex 920 and vertex 918. Therefore, the minimum rectangular bounding box enclosing manhattan polygon 900 is divided into the plurality of grids that includes a grid 922, a grid 924, a grid 926, a grid 928, a grid 930, a grid 932, a grid 934, a grid 936, a grid 938, a grid 940, a grid 942, and a grid 944. The plurality of grids corresponds to a VSG for manhattan polygon 900.

Each grid of manhattan polygon 900 in the VSG is either completely occupied or is completely unoccupied by a portion of manhattan polygon 900. The VSG is used to generate a VSB that represents the virtual topological polygon corresponding to manhattan polygon 900. To represent the virtual topological polygon using VSB, each grid in the VSG that is fully occupied by a portion of manhattan polygon 900 is assigned a bit value of '1' and each grid that is fully unoccupied by any portion of manhattan polygon 900 is assigned a bit value of '0'. Therefore, each of grid 922, grid 924, grid 926, grid 928, grid 930, grid 932 and grid 934 are represented by the bit value '1' as they are completely occupied by a corresponding portion of manhattan polygon 900. However, grid 936, grid 938, grid 940, grid 942, and grid 944 are represented by the bit value '0' as they are completely unoccupied by any corresponding portion of manhattan polygon 900. The VSB of the virtual topological polygon corresponding to manhattan polygon 900 is used to generate a signature bitmap 946. Signature bitmap 946 is derived by removing grids from the VSB and retaining the bit values assigned to each grid in the order that they were assigned to each grid in the VSB. Signature bitmap 946 represents the topological characteristics information of manhattan polygon 900 or the virtual topological polygon corresponding to manhattan polygon 900.

Referring back to FIG. 7, virtual topological polygon for manhattan polygon 900 corresponds to virtual topological polygon 704. Therefore, each of virtual topological polygon 702, virtual topological polygon 706, virtual topological polygon 708, virtual topological polygon 710, virtual topological polygon 712, virtual topological polygon 714, and virtual topological polygon 716 may be generated by rotating or/and reflecting signature bitmap 946. The rotations may be along one of 0 degree, 90 degree, 180 degree and 270 degree and reflections may be along the X axis and the Y axis. For example, signature bitmap 946 may be rotated by angle of 90 degrees in counter clockwise direction to generate a signature bitmap of polygon 702, which may be represented by expression 19 given below:

$$\begin{bmatrix} (1,0,0,0) \\ (1,0,1,0) \\ (1,1,1,1) \end{bmatrix} \quad (19)$$

Similarly, signature bitmap 946 may be reflected along the Y axis to generate a signature bitmap for virtual topological polygon 706, which is represented by expression 20. Similarly, signature bitmap 946 may be reflected along the X axis to generate a signature bitmap for virtual topological polygon 708, which is represented by expression 21. Similarly, signature bitmap 946 may be rotated and/or reflected to generate each of a signature bitmap for virtual topological polygon 710 (represented by expression 22), a signature bitmap for virtual topological polygon 712 (represented by expression 23), a signature bitmap for polygon virtual topological 714 (represented by expression 24), a signature bitmap for virtual topological polygon 716 (represented by expression 25), given below:

$$\begin{bmatrix} (1,1,1) \\ (0,0,1) \\ (0,1,1) \\ (0,0,1) \end{bmatrix} \quad (20)$$

$$\begin{bmatrix} (1,0,0) \\ (1,1,0) \\ (1,0,0) \\ (1,1,1) \end{bmatrix} \quad (21)$$

$$\begin{bmatrix} (0,0,1) \\ (0,1,1) \\ (0,0,1) \\ (1,1,1) \end{bmatrix} \quad (22)$$

$$\begin{bmatrix} (0,0,0,1) \\ (0,1,0,1) \\ (1,1,1,1) \end{bmatrix} \quad (23)$$

$$\begin{bmatrix} (1,1,1,1) \\ (1,0,1,0) \\ (1,0,0,0) \end{bmatrix} \quad (24)$$

$$\begin{bmatrix} (1,1,1,1) \\ (0,1,0,1) \\ (0,0,0,1) \end{bmatrix} \quad (25)$$

The standard canonical orientation, i.e., virtual topological polygon 702, is determined by arranging signature bitmap of each virtual topological polygon in a predefined order. In accordance with one exemplary embodiment of the invention, this predefined order may be unfolding a signature bitmap starting from the lowest row and leftmost column of the signature bit map. Therefore, when signature bitmap 946 corresponding to virtual topological polygon 702 is arranged in the predefined order, it may be represented as [111110101000], which is numerically the highest value as compared to similarly arranged signature bitmap of any other virtual topological polygons belonging to the same ISOGeom. Therefore, virtual topological polygon 702 is determined as the standard canonical orientation and signature bitmap given by equation 19 is used to represent the ISOGeom.

After determining the VSB of manhattan polygon 900, dimensional data corresponding to manhattan polygon 900 may be combined with VSB to create a sized polygon from the virtual topological polygon corresponding to manhattan polygon 900. The dimensional data for manhattan polygon 900 is extracted by calculating the DV for manhattan polygon 900. The DV specifies the dimensions of manhattan polygon 900 for converting the corresponding virtual topological polygon into a sized polygon. The DV for manhattan polygon 900 has two vectors, i.e., DX and DY. DX corresponds to the number of vertical grid lines and DY corresponds to the number of horizontal grid lines. Further, the value of each element in DX specifies distance between two consecutive vertical grid lines and DY specifies distance between two consecutive horizontal grid lines. Therefore, referring back to FIG. 4, the DV for manhattan polygon 900 may be represented by equation 26 in the same manner as that for polygon 400.

$$DX=[1,2,2]; DY=[3,1,2,1] \quad (26)$$

To generate a sized polygon corresponding to manhattan polygon 900, the DV is combined with the VSB of manhattan polygon 900. The number of values in DX correspond to the number of columns in the VSB for manhattan polygon 900 and the order of values in DX correspond to the order of columns in the VSB for manhattan polygon 900. Therefore, dimension along the X axis of each grid in the VSB of manhattan polygon 900 is determined by the corresponding value in DX. Similarly, the number of values in DY correspond to the number of rows in the VSB for manhattan polygon 900 and the order of values in DY correspond to the order of rows in the VSB for manhattan polygon 900. Therefore, dimension along the Y axis of each grid in the VSB of manhattan polygon 900 is determined by the corresponding value in DY. Thereafter, the spatial data is extracted for the sized Manhattan polygon and origin or the X and Y co-ordinates of vertex 902 are determined. Based on the X and Y co-ordinates of vertex 902, co-ordinates of each vertex of manhattan polygon 900 are determined, therefore, manhattan polygon 900 is instantiated and can be placed spatially.

Figure 10:
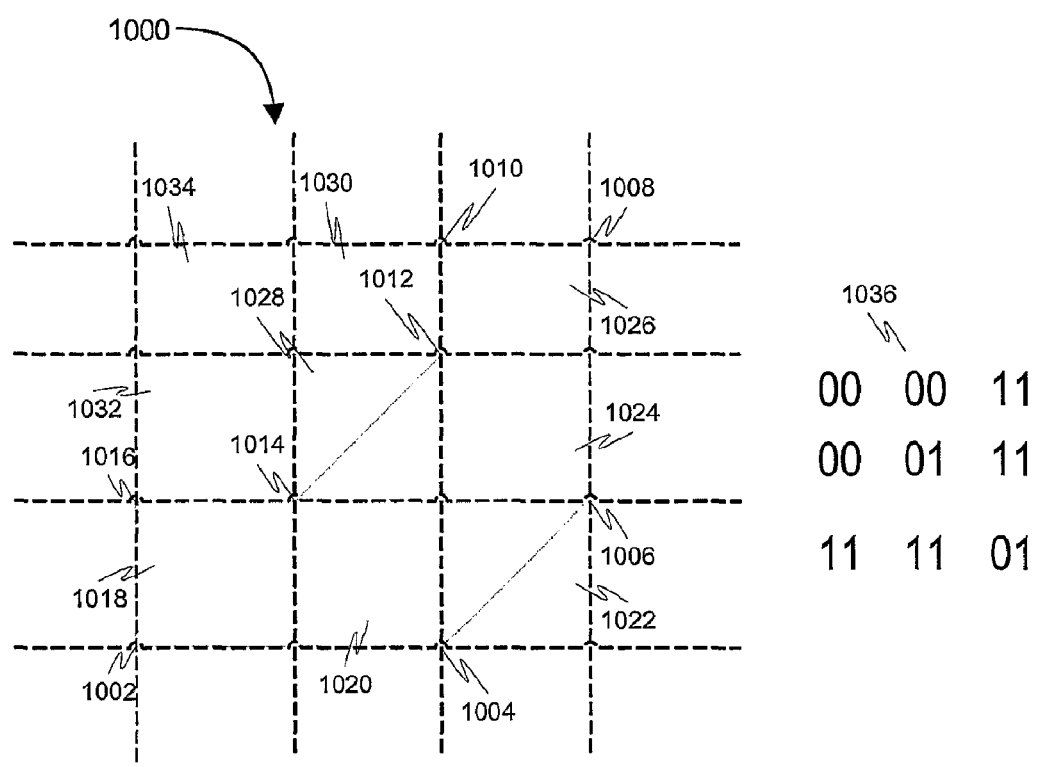
FIG. 10 is a block diagram showing representation of a non-manhattan polygon 1000 in the geometrical layout design data using a VSG, in accordance with an exemplary embodiment of the invention.

FIG. 10 is a block diagram showing representation of a non-manhattan polygon 1000 in the geometrical layout design data using a VSG, in accordance with an exemplary embodiment of the invention. In a non-manhattan polygon one or more edges are non-orthogonal. The vertices of non-manhattan polygon 1000 are numbered in counter clockwise direction. Non-manhattan polygon 1000 includes a vertex 1002, a vertex 1004, a vertex 1006, a vertex 1008, a vertex 1010, a vertex 1012, a vertex 1014, and a vertex 1016.

Non-manhattan polygon 1000 is scanned using a vertical sweep-line and a horizontal sweep-line to extract the topological characteristics data for non-manhattan polygon 1000 to form a corresponding virtual topological polygon. As a result of this, non-manhattan polygon 1000 is divided into a plurality of grids by horizontal grid lines and vertical grid lines. A first horizontal grid line passes through vertex 1002 and vertex 1004, a second horizontal grid line passes through vertex 1016, vertex 1014, and vertex 1006, a third horizontal grid line passes through vertex 1012, a fourth horizontal grid line passes through vertex 1010, and vertex 1008. Similarly, a first vertical grid line passes through vertex 1002 and vertex 1016, a second vertical grid line passes through vertex 1014, a third vertical grid line passes through vertex 1004, vertex 1012, and vertex 1010, a fourth vertical grid line passes through vertex 1006 and vertex 1008. Therefore, the minimum rectangular bounding box enclosing the non-manhattan polygon 1000 is divided into the plurality of grids that includes a grid 1018, a grid 1020, a grid 1022, a grid 1024, a grid 1026, a grid 1028, a grid 1030, a grid 1032, and a grid 1034. The plurality of grids corresponds to a VSG for non-manhattan polygon 1000.

Each grid in the VSG is one of completely occupies, unoccupied, and partially occupied by a portion of non-manhattan polygon 1000. The VSG is used to generate a VSB that represents the virtual topological polygon corresponding to non-manhattan polygon 1000. In accordance of an exemplary embodiment of the invention, to represent the virtual topological polygon using VSB, a grid that is completely occupied by a portion of non-manhattan polygon 1000, is assigned a bit value of '11', a grid that is completely unoccupied by a portion of non-manhattan polygon 1000 is assigned a bit value of '00', and a grid that is partially occupied by a portion of non-manhattan polygon 1000 is assigned a bit value of '01' if the non-orthogonal edge of the non-manhattan polygon 1000 runs from south-west to north-east within the grid, and a grid that is partially occupied by a portion of non-manhattan polygon 1000 is assigned a bit value of '10' if the non-orthogonal edge of the non-manhattan polygon 1000 runs from north-west to south-east within the grid. Therefore, each of grid 1018, grid 1020, grid 1024 and grid 1026 are represented by the bit value '11', as they are completely occupied by a portion of non-manhattan polygon 1000. Further, grid 1030, grid 1032, and grid 1034 are represented by '00', as they are completely unoccupied by any portion of non-manhattan polygon 1000. Additionally, grid 1022 and grid 1028 are represented by the bit value '01', as they are partially occupied by a portion of non-manhattan polygon 1000 and the non-orthogonal edge of the non-manhattan polygon 1000 runs from south-west to north-east within these grids. The VSB of the virtual topological polygon corresponding to non-manhattan polygon 1000 is used to generate a signature bitmap 1036. Signature bitmap 1036 is derived by removing grids from the VSB and retaining the bit values assigned to each grid in the order that they were assigned to each grid in the VSB. Signature bitmap 1036 represents the topological characteristics information of non-manhattan polygon 1000 or the virtual topological polygon corresponding to non-manhattan polygon 1000.

Thereafter, dimensional data corresponding to non-manhattan polygon 1000 may be combined with the VSB to create a sized polygon from the virtual topological polygon corresponding to non-manhattan polygon 1000. The method for generating a sized polygon from the virtual topological polygon corresponding to non-manhattan polygon 1000 is similar to that for manhattan polygon 900 that has been explained in detail in FIG. 9. Thereafter, spatial data is extracted for the sized polygon and origin or the X and Y co-ordinates of vertex 1002 are determined. Based on this the X and Y co-ordinates of each vertex of non-manhattan polygon 1000 are instantiated, as a result of which it can be placed spatially.

Figure 11:
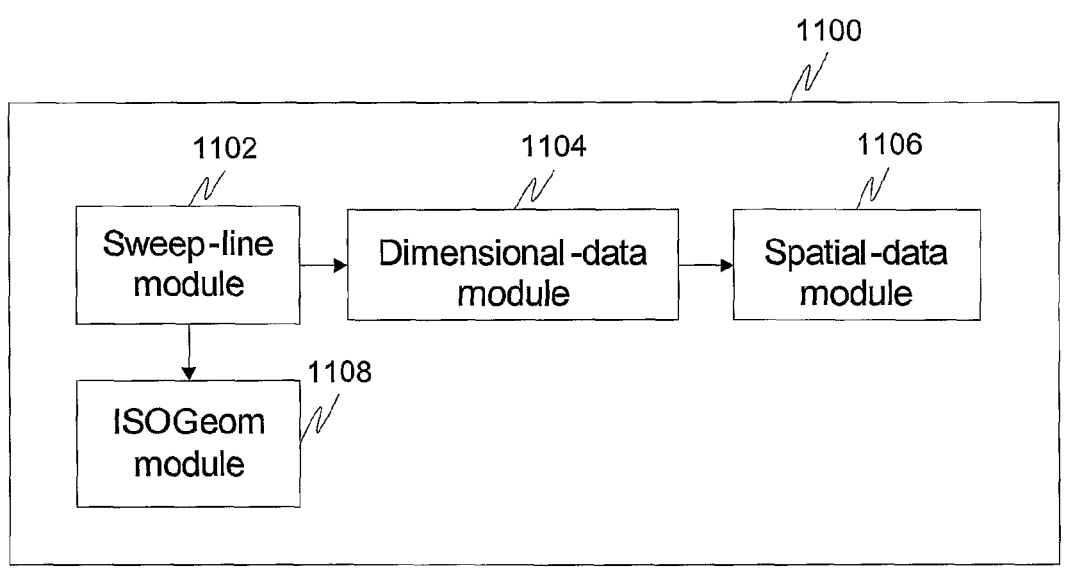
FIG. 11 is a block diagram showing various components of a system 1100 for representing geometrical layout design data, in accordance with an embodiment of the invention.

FIG. 11 is a block diagram showing various components of a system 1100 for representing geometrical layout design data, in accordance with an embodiment of the invention. System 1100 includes a sweep-line module 1102, a dimension-data module 1104, and a spatial-data module 1106. Sweep-line module 1102 extracts topological characteristics data corresponding to the plurality of polygons to form a plurality of virtual topological polygons. Each virtual topological polygon is represented by one or more SOs. An SO of one or more virtual topological polygon corresponds to the order of vertices of one or more corresponding polygons encountered by a sweep-line moving in a predefined direction. The sweep-line has a predefined angular orientation. The sweep-line may be a vertical sweep-line moving in a horizontal direction. Alternatively, the sweep-line may be a horizontal sweep-line moving in a vertical direction. This has been explained in detail in conjunction with FIG. 2 and FIG. 3.

Thereafter, an ISOGeom module 1108 aggregates virtual topological polygons having identical SO into an ISOGeom. An ISOGeom includes one of a set of virtual topological polygons and a plurality of sets of distinct virtual topological polygons. Each virtual topological polygon in the set of virtual topological polygons corresponds to one or more of a rotation and a reflection of a standard canonical orientation for the set of virtual topological polygons. This has been explained in detail in conjunction with FIG. 2 and FIG. 3. Further, each distinct virtual topological polygon in a set of distinct topological polygon has a dissimilar SO. Each set of distinct virtual topological polygon corresponds to one or more of a rotation and a reflection of a standard canonical orientation for the plurality of sets of distinct topological polygons. This has been explained in detail in conjunction with FIG. 2 and FIG. 3.

After extracting the topological characteristics data for the plurality of polygons, dimension-data module 1104 determines dimensional data corresponding to each virtual topological polygon to form a plurality of sized polygons. A sized polygon corresponds to a virtual topological polygon. The components of dimensional-data module 1104 are further explained in detail in conjunction with FIG. 12. In an embodiment of the invention, the topological characteristics data of each polygon is represented by SO is combined with its corresponding dimensional data to form sized polygons. In another embodiment of the invention, the topological characteristics data of each polygon is represented by VSG and is combined with its corresponding dimensional data to form sized polygons. This has been explained in detail in conjunction with FIG. 2 and FIG. 3.

After the plurality of sized polygons are generated, spatial-data module 1106 extracts spatial data of each sized polygon and instantiates each sized polygon to form a instantiated polygon. The spatial data for a sized polygon includes one or more of an orientation value, an origin of instantiation, and attribute information for the sized polygon. This has been explained in detail in conjunction with FIG. 2.

Figure 12:
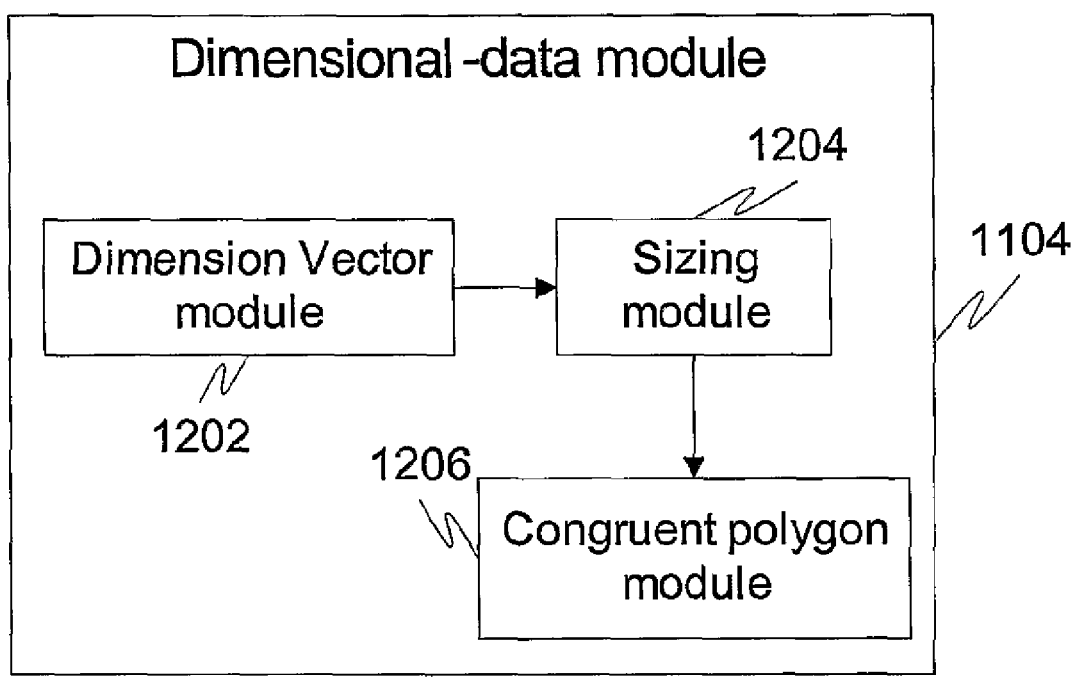
FIG. 12 is a block diagram showing various components of dimension-data module, in accordance with an embodiment of the invention.

FIG. 12 is a block diagram showing various components of dimension-data module 1104, in accordance with an embodiment of the invention. Dimension-data module 1104 includes a Dimension Vector (DV) module 1202, a sizing module 1204, and a congruent polygon module 1206. DV module 1202 calculates a DV for a virtual topological polygon. A DV specifies the location of a first vertex with respect to a second vertex in the virtual topological polygon. This has been explained in conjunction with FIG. 3 and FIG. 8. Thereafter, sizing module 1204 combines a virtual topological polygon with DV of the virtual topological polygon to form a corresponding sized polygon. Congruent polygon module 1206 thereafter aggregates a set of sized polygons as congruent polygons. Each sized polygon in the congruent polygons has the same SO and DV. This has been explained in conjunction with FIG. 2, FIG. 3 and FIG. 8.

Figure 13:
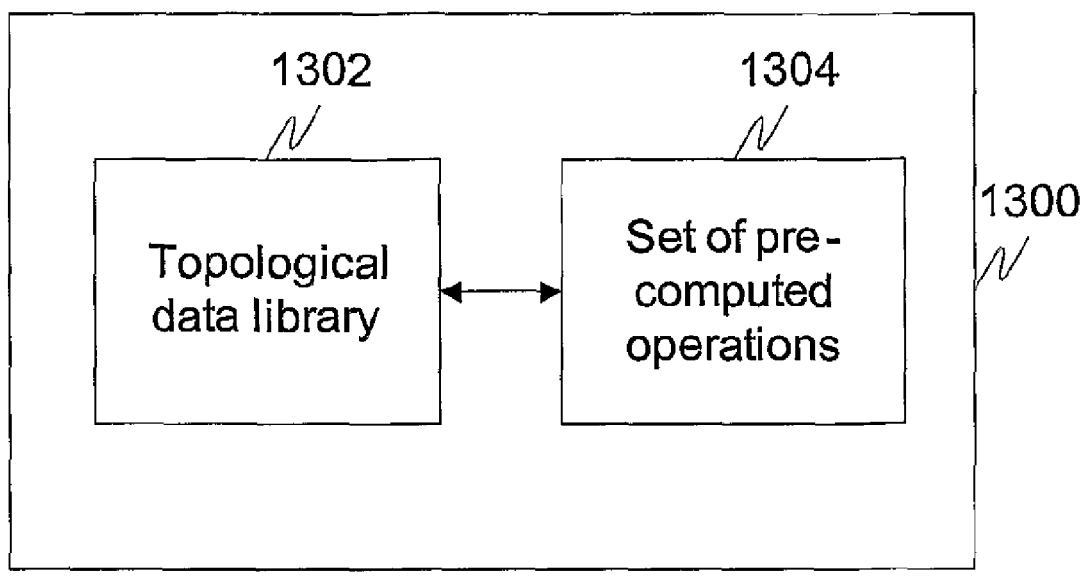
FIG. 13 is a block diagram showing a system for performing geometrical operations on geometrical layout design data in electronic design systems, in accordance with an embodiment of the invention

FIG. 13 is a block diagram showing a system 1300 for performing geometrical operations on geometrical layout design data in electronic design systems, in accordance with an embodiment of the invention. The geometrical layout design data includes a plurality of polygons. System 1300 comprises a topological data library 1302. Topological data library 1302 stores topological characteristics data corresponding to the plurality of polygons. Topological characteristics data is stored to form a plurality of virtual topological polygons. Each virtual topological polygon is represented by an SO. This has been explained in detail in conjunction with FIG. 2. Therefore, a virtual topological polygon may simply point to topological data library 1302 to determine topological characteristics data for itself instead of storing the topological characteristic data within itself. This reduces the memory requirement of a virtual topological polygon.

Topological data library 1302 may be an Identical Scan Order Geometries (ISOGeom) library. The ISOGeom library stores topological characteristics data for one of a set of virtual topological polygons and a plurality of sets of distinct virtual topological polygons. The ISOGeom has been explained in conjunction with FIG. 3. One or more DVs may be combined with the ISOGeom library to form one or more congruent polygon libraries. Each polygon in a congruent polygon library has same SO and DV. Thereafter, spatial data may be combined with a congruent polygon library to generate a plurality of instantiated polygons.

System 1300 further includes a set of pre-computed operations 1304. Examples of the pre-computed geometric operations may include, but are not limited to pattern check, unary operations, window query, resizing, topological sorting, congruency finding, and Boolean operations. One or more pre-computed operations from set of pre-computed operations 1304 are performed on the topological characteristics data stored in topological data library 1302. For example, geometric operation like pattern check can be performed directly on topological data library 1302 instead of each individual virtual topological polygon. Similarly, one or more pre-computed operation may also be performed on the congruent polygon library. For example, geometric operations like, width check, jog check, notch check, acute angle check, and area check may be directly applied directly to the congruent polygon library instead of each sized polygon individually.

Various embodiments of the invention provide methods and systems of representing geometrical layout design data having a plurality of polygons in electronic design systems. The method includes extracting topological characteristics data corresponding to one or more polygons to form one or more virtual topological polygon. Each virtual polygon is represented by one or more Scan order (SOs), with SO corresponding to order in which the vertices of polygon are encountered by a sweep line moving in predefined direction with a predefined angular orientation. The method further includes determining dimensional data corresponding to each polygon to form one or more sized polygons using one or more virtual topological polygon. Thereafter, the spatial data corresponding to each sized polygon is extracted to instantiate each sized polygon.

Further, various embodiments of the invention can be applied in the following areas of topological sorting, congruency finding, logical hierarchy creations, hierarchy ISOgeoms, fracturing of polygons, rule checks, for specifying multiple polygons through common ISOGeoms, Optical proximity correction tools, Boolean operators, mask data preparation, layout data compression, CAD navigation, mask inspection, graphical viewer etc.

Additionally, various embodiments of the invention capture the topological information of the polygons and allows for sharing of topological properties among several different polygons. The order of vertices is captured instead of the dimensions and location of the vertices which reduces the computation time significantly. Common characteristics like shape and size of similar as well as dissimilar polygons are shared together over geometrical layout design data and the common data is distributed in a compact manner over all the polygons reducing memory requirements. The common topological information is appended with different dimensional data and spatial data to create distinct instantiated sized polygons, reducing the computational time involved.

Further, most of the scan-line based algoritluns require sorting of the vertices in a direction perpendicular to the scan-line. As the scan line moves from one position to another, sorting of vertices is required. The implementation of ISOGeom is based on the scan orders of the polygons by which the ordering of vertices is inherently available. Thereby, usage of ISOGeom in scan line based algorithm avoids frequent sorting of the vertices and speeds up the operations and reduces the time and I/O operations in memory.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. A method of representing geometrical layout design data having a plurality of polygons in electronic design systems, the method comprising:
   a. extracting topological characteristics data corresponding to the plurality of polygons to form a plurality of virtual topological polygons, wherein each virtual topological polygon is represented by a Scan Order (SO), the SO comprising:
      a Vertical Scan Order (VSO) of at least one virtual topological polygon corresponding to the order of vertices of at least one corresponding polygon encountered by a sweep-line moving in a horizontal direction, wherein the sweep-line has a vertical orientation and
      a Horizontal Scan Order (HSO) of at least one virtual topological polygon corresponding to the order of vertices of at least one corresponding polygon encountered by a sweep-line moving in a vertical direction, wherein the sweep-line has a horizontal orientation;
   b. determining dimensional data corresponding to each virtual topological polygon to form a plurality of sized polygons, wherein a sized polygon corresponds to a virtual topological polygon; and
   c. extracting spatial data corresponding to each sized polygon, wherein extracting spatial data instantiates sized polygons to generate a plurality of instantiated polygons, wherein at least one of the steps of extracting topological characteristics, determining dimensional data, or extracting spatial data is implemented using a layout design system.

2. The method of claim 1, wherein determining dimensional data comprises calculating a Dimension Vector (DV), the DV comprising a set of two single dimensional vectors of a virtual topological polygon,
   one single dimensional vector specifying the X-displacement of a first vertex with respect to a second vertex in the virtual topological polygon and
   the other single dimensional vector specifying the Y-displacement of a first vertex with respect to a second vertex in the virtual topological polygon, wherein calculating a DV for a virtual topological polygon is equivalent to converting it to a sized polygon.

3. The method of claim 2, wherein virtual topological polygons having identical SO are aggregated as Identical Scan Order Geometries (ISOGeoms), wherein an ISOGeom comprises one of:
   a. a set of virtual topological polygons, wherein each virtual topological polygon in the set of virtual topological polygons corresponds to at least one of a rotation and a reflection of a canonical orientation for the set of virtual topological polygons; and
   b. a plurality of sets of distinct virtual topological polygons, wherein each distinct virtual topological polygon in a set of distinct virtual topological polygon has a dissimilar SO, wherein each set of distinct virtual topological polygon corresponds to at least one of a rotation and a reflection of a canonical orientation for the plurality of sets of distinct virtual topological polygons.

4. The method of claim 3, wherein each virtual topological polygon in the set of virtual topological polygons, if oriented to generate a canonical orientation for the set of virtual topological polygons has each of:
   a. same SO determined by a first sweep-line; and
   b. same SO determined by a second sweep-line, wherein the first sweep-line moves orthogonally to the second sweep-line.

5. The method of claim 4, wherein each set of distinct virtual topological polygons, if oriented to generate a canonical orientation for the plurality of sets of distinct virtual topological polygons has each of:
   a. same SO determined by the first sweep-line; and
   b. same SO determined by the second sweep-line, wherein the first sweepline moves orthogonally to the second sweep-line.

6. The method of claim 5, wherein the number of distinct virtual topological polygons in a set of distinct virtual topological polygons and the number of vertices in each distinct virtual topological polygon are specified using a first predefined representation.

7. The method of claim 6, wherein the first predefined representation is associating each set of distinct virtual topological polygons with a Vertex Count Vector (VCV), a VCV comprises a plurality of elements, wherein the plurality of elements correspond to the number of distinct virtual topological polygons in a set of distinct virtual topological polygons, each element corresponds to the number of vertices of a distinct virtual topological polygons in a set of distinct virtual topological polygons.

8. The method of claim 5, wherein each of virtual topological polygons having same VSO and sets of distinct virtual topological polygons having same VSO are aggregated as Vertically Similar Scan Ordered Geometries (VSSOGeoms).

9. The method of claim 5, wherein a set of sized polygons is aggregated as congruent polygons, wherein each sized polygon in the congruent polygons has same SO and DV.

10. The method of claim 5, wherein each of a VSO and an HSO comprise a plurality of displacement operators, a displacement operator specifies the order of encountering each vertex of a virtual topological polygon by a corresponding sweep-line.

11. The method of claim 10, wherein each of a VSO and an HSO of a virtual topological polygon is represented using each of:
   a. a plurality of sets of directional pattern bits, wherein each set of directional pattern bits correspond to direction of a first vertex with respect to a second vertex of a virtual topological polygon, the first vertex is separated from the second vertex by a displacement operator; and
   b. vertices list, wherein the vertices list corresponds to the order of vertices represented by one of the VSO and the HSO of the virtual topological polygon.

12. The method of claim 5, wherein a sized polygon is generated by combining the DV for a virtual topological polygon with one of the VSO and the HSO of the virtual topological polygon.

13. The method of claim 5, wherein a Variable Sized Grid (VSG) is created for an ISOGeom, a VSG divides one of:
   a. each virtual topological polygon in an ISOGeom into a first plurality of portions, if the ISOGeom comprises the plurality of virtual topological polygons; and
   b. each set of distinct virtual topological polygons into a second plurality of portions, if the ISOGeom comprises the plurality of sets of distinct virtual topological polygons.

14. The method of claim 13, wherein a VSG is created for each of a virtual topological polygon and a set of distinct virtual topological polygon after scanning using each of the vertical sweep-line and the horizontal sweep-line.

15. The method of claim 13, wherein a Variable Sized Bitmap (VSB) is created for each of a virtual topological polygon and a set of distinct virtual topological polygons using the corresponding VSG, a VSB represents one of the first plurality of portions of a virtual topological polygon and the second plurality of portions of a set of distinct virtual topological polygons using a predefined notation.

16. The method of claim 15, wherein each virtual topological polygon and each set of distinct virtual topological polygons in an ISOGeom are represented using a signature bitmap derived from a corresponding VSB.

17. The method of claim 16, wherein a sized polygon is generated by combining the DV for a virtual topological polygon with a VSB of the virtual topological polygon.

18. The method of claim 16, wherein a signature bitmap of a first virtual topological polygon is processed to generate a second virtual topological polygon.

19. The method of claim 16, wherein a canonical orientation in an ISOGeom is based upon a predefined characteristic of the signature bitmap arranged in a predefined order.

20. The method of claim 19, wherein the signature bitmap of a canonical orientation for an ISOGeom represents the ISOGeom.

21. The method of claim 5, wherein each of the virtual topological polygons having the same HSO and sets of distinct virtual topological polygons having the same HSO are aggregated as Horizontally Similar Scan Ordered Geometries (HSSOGeoms).

22. The method of claim 5, wherein each of virtual topological polygons having same HSO and VSO and sets of distinct virtual topological polygons having same HSO and VSO are aggregated as Horizontally and Vertically Identical Scan Order Geometries (HVISOGeoms).

23. The method claim 3, wherein each virtual topological polygon in the set of virtual topological polygons is a virtual-topological hole-polygon, a virtual-topological hole-polygon corresponds to a single filled virtual topological polygon with at least one unfilled virtual topological polygon, wherein the filled virtual topological polygon comprises the at least one unfilled virtual topological polygon.

24. The method of claim 23, wherein the single filled virtual topological polygon and the number unfilled virtual topological polygons in a virtual topological holepolygon and the number of vertices in filled virtual topological polygon and each unfilled virtual topological polygon are specified using a second predefined representation.

25. The method of claim 24, wherein the second predefined representation is associating each hole-polygon with a hole-Vertex Count Vector (VCV), wherein a hole-VCV comprises a positive element and a plurality of negative elements, the positive element corresponds to the number of vertices of the single filled virtual topological polygon and a negative element corresponds to the number of vertices of an unfilled virtual topological polygon.

26. The method of claim 1, wherein spatial data for an instantiated polygon comprises at least one of:
   a. an orientation value of the instantiated polygon, wherein the orientation value corresponds to orientation of the instantiated polygon relative to a canonical orientation of the sized polygon;
   b. an origin of instantiation, wherein the origin of instantiation of the instantiated polygon places the sized polygon spatially; and
   c. attribute information, wherein the attribute information of the instantiated polygon comprises a plurality of attributes of the instantiated polygon.

27. A system for representing geometrical layout design data having a plurality of polygons in electronic design systems, the system comprising:
   a. a sweep-line module, wherein the sweep-line module extracts topological characteristics data corresponding to the plurality of polygons to form a plurality of virtual topological polygons, wherein each virtual topological polygon is represented by a Scan Order (SO), the SO comprising:
      a Vertical Scan Order (VSO) of at least one virtual topological polygon corresponding to the order of vertices of at least one corresponding polygon encountered by a sweep-line moving in a horizontal direction, wherein the sweep-line has a vertical orientation and
      a Horizontal Scan Order (HSO) of at least one virtual topological polygon corresponding to the order of vertices of at least one corresponding polygon encountered by a sweep-line moving in a vertical direction, wherein the sweep-line has a horizontal orientation;
   b. a dimension-data module, wherein the dimension-data module determines dimensional data corresponding to each virtual topological polygon to form a plurality of sized polygons, wherein a sized polygon corresponds to a virtual topological polygon; and
   c. a spatial-data module, wherein the spatial-data module extracts spatial data corresponding to each sized polygon, wherein extracting spatial data instantiates sized polygon to generate a plurality of instantiated polygons.

28. The system of claim 27, further comprising an Identically Scan Order Geometries (ISOGeom) module, wherein the ISOGeom module aggregates virtual topological polygons having identical SO into an ISOGeom, wherein an ISOGeom comprises one of:
   a. a set of virtual topological polygons, wherein each virtual topological polygon in the set of virtual topological polygons corresponds to at least one of a rotation and a reflection of a canonical orientation for the set of virtual topological polygons; and b. a plurality of sets of distinct virtual topological polygons, each distinct virtual topological polygon in a set of distinct topological polygon has a dissimilar SO, wherein each set of distinct virtual topological polygon corresponds to at least one of a rotation and a reflection of a canonical orientation for the plurality of sets of distinct topological polygons.

29. The system of claim 28, wherein the dimension-data module comprises a Dimension Vector (DV) module to calculate a DV of a virtual topological polygon, the DV specifies the location of a first vertex with respect to a second vertex in the virtual topological polygon.

30. The system of claim 29, wherein the dimension-data module comprises a congruent-polygon module, the congruent-polygon module aggregates a set of sized polygons as congruent polygons, wherein each sized polygon in the congruent polygons has same SO and DV.

31. The system of claim 30, wherein the dimension-data module comprises a sizing module, the sizing module combines a virtual topological polygon with DV of the virtual topological polygon to form a corresponding sized polygon.

32. A system for performing geometrical operations on geometrical layout design data having a plurality of polygons in electronic design systems, the system comprising:
 a. a topological data library, wherein the topological data library stores topological characteristics data corresponding to the plurality of polygons, topological characteristics data is stored to form a plurality of virtual topological polygons, wherein each virtual topological polygon is represented by a Scan Order (SO), the SO comprising:
  a Vertical Scan Order (VSO) of at least one virtual topological polygon corresponding to the order of vertices of at least one corresponding polygon encountered by a sweep-line moving in a horizontal direction wherein the sweep-line has a vertical orientation and
  a Horizontal Scan Order (HSO) of at least one virtual topological polygon corresponding to the order of vertices of at least one corresponding polygon encountered by a sweep-line moving in a vertical direction, wherein the sweep-line has a horizontal orientation; and
 b. a set of pre-computed operations, wherein a pre-computed operation from the set of pre-computed operations is performed on the topological characteristics data, the result of the pre-computed operation is stored in the topological data library.

33. The system of claim 32, wherein the topological data library is an Identical Scan Order Geometries (ISOGeom) library, the ISOGeom library stores topological characteristics data for one of:
 a. a set of virtual topological polygons, wherein each virtual topological polygon in the set of virtual topological polygons corresponds to at least one of a rotation and a reflection of a canonical orientation for the set of virtual topological polygons; and
 b. a plurality of sets of distinct virtual topological polygons, each distinct virtual topological polygon in a set of distinct virtual topological polygons has a dissimilar SO, wherein each set of distinct virtual topological polygons corresponds to at least one of a rotation and a reflection of a canonical orientation for the plurality of sets of distinct virtual topological polygons.

34. The system of claim 33, wherein at least one Dimension Vector (DV) is combined with the ISOGeom library to form at least one congruent polygon library, a DV specifies the location of a first vertex with respect to a second vertex of a corresponding virtual topological polygon, wherein each polygon in a congruent polygon library has same SO and DV.

* * * * *